US011768974B2

(12) United States Patent
Gallo et al.

(10) Patent No.: US 11,768,974 B2
(45) Date of Patent: Sep. 26, 2023

(54) BUILDING INFORMATION MODEL (BIM) ELEMENT EXTRACTION FROM FLOOR PLAN DRAWINGS USING MACHINE LEARNING

(71) Applicant: Autodesk, Inc., San Francisco, CA (US)

(72) Inventors: Emmanuel Gallo, Mougins (FR); Yan Fu, San Carlos, CA (US); Keith Alfaro, Brooklyn, NY (US); Manuel Martinez Alonso, Malaga (ES); Simranjit Singh Kohli, Cambridge, MA (US); Graceline Regala Amour, Somerville, MA (US)

(73) Assignee: AUTODESK, INC., San Francisco, CA (US)

( * ) Notice: Subject to any disclaimer, the term of this patent is extended or adjusted under 35 U.S.C. 154(b) by 308 days.

(21) Appl. No.: 16/951,750

(22) Filed: Nov. 18, 2020

(65) Prior Publication Data

US 2021/0150088 A1 May 20, 2021

Related U.S. Application Data

(60) Provisional application No. 62/937,049, filed on Nov. 18, 2019, provisional application No. 62/937,053, filed on Nov. 18, 2019.

(51) Int. Cl.
*G06F 30/13* (2020.01)
*G06N 20/00* (2019.01)
*G06F 16/21* (2019.01)
*G06F 30/12* (2020.01)

(52) U.S. Cl.
CPC ............ *G06F 30/13* (2020.01); *G06F 16/211* (2019.01); *G06F 30/12* (2020.01); *G06N 20/00* (2019.01)

(58) Field of Classification Search
CPC ....................................... G06F 30/13
See application file for complete search history.

(56) References Cited

U.S. PATENT DOCUMENTS

| 10,997,325 | B2 * | 5/2021 | Austern | G06F 30/20 |
| 2002/0147694 | A1 * | 10/2002 | Dempsey | G06N 3/08 706/20 |
| 2011/0218777 | A1 * | 9/2011 | Chen | G06F 30/00 703/1 |

(Continued)

OTHER PUBLICATIONS

Huang, W., et al., "Architectural Drawings Recognition and Generation through Machine Learning", ACADIA, 2018, pp. 156-165.

(Continued)

*Primary Examiner* — Ryan F Pitaro
(74) *Attorney, Agent, or Firm* — Gates & Cooper LLP

(57) ABSTRACT

A method and system provide the ability to generate and use synthetic data to extract elements from a floor plan drawing. A room layout is generated. Room descriptions are used to generate and place synthetic instances of symbol elements in each room. A floor plan drawing is obtained and pre-processed to determine a drawing area. Based on the synthetic data symbols in the floor plan drawing are detected. Orientations of the detected symbols are also detected. Based on the detected symbols and orientations, building information model (BIM) elements are fetched and placed in the floor plan drawing.

22 Claims, 13 Drawing Sheets

(56) References Cited

U.S. PATENT DOCUMENTS

| | | | |
|---|---|---|---|
| 2017/0091885 A1* | 3/2017 | Randolph | G06T 3/00 |
| 2017/0154263 A1 | 6/2017 | Deretsky et al. | |
| 2018/0032643 A1* | 2/2018 | Wright | G06F 30/18 |
| 2019/0057520 A1 | 2/2019 | Cinnamon et al. | |
| 2019/0266293 A1* | 8/2019 | Ishida | G06T 17/00 |
| 2019/0385297 A1* | 12/2019 | Khosrowpour | G06T 17/00 |
| 2021/0073449 A1* | 3/2021 | Segev | G06F 30/20 |
| 2022/0148327 A1* | 5/2022 | Fu | G06V 30/422 |
| 2022/0327316 A1* | 10/2022 | Grauman | G06N 3/08 |

OTHER PUBLICATIONS

Camozzato, D., "A Method for Growth-Based Procedural Floor Plan Generation", Pontifícia Universidade Católica Do Rio Grande Do Sul Faculdade De Informática Programa De Pós-Graduação Em Ciência Da Computação, 2015, pp. 1-75.

Lopes, R., et al., "A Constrained Growth Method for Procedural Floor Plan Generation", Conference: Proceedings of 11th Int. Conf. Intell. Games Simul., Jan. 2010, pp. 1-7.

Ecer, D., et al., "ScienceBeam—using computer vision to extract PDF data", Aug. 4, 2017, https://elifesciences.org/labs/5b56aff6/sciencebeam-using-computer-vision-to-extract-pdf-data, as downloaded Nov. 12, 2020, pp. 1-15.

Rahul, R., et al., "Automatic Information Extraction from Piping and Instrumentation Diagrams", Computer Vision and Pattern Recognition, Jan. 2019, pp. 1-10.

Adam, S., et al., "Symbol and Character Recognition: Application to Engineering Drawings", IJDAR, 2000, 1-37, vol. 3, No. 2.

Collin, S., et al., "Syntactic Analysis of Technical Drawing Dimensions", International Journal of Pattern Recognition and Artificial Intelligence, 1994, pp. 1131-1148, vol. 8, No. 5.

Dosch, P., et al., "Improving Arc Detection in Graphics Recognition", Proceedings 15th International Conference on Pattern Recognition, 2000, pp. 243-246, vol. 2.

Armand, J-P., "Musical Score Recognition: A Hierarchical and Recursive Approach", ICDAR, 1993, pp. 1-4.

Randriamahefa, R., et al., "Printed music recognition", Conference: Document Analysis and Recognition, 1993, pp. 1-5.

Valveny, E., et al., "Hand-Drawn Symbol Recognition in Graphic Documents Using Deformable Template Matching and a Bayesian Framework", Proceedings of 15th. Int. Conf. on Pattern Recognition, Jan. 2000, pp. 239-242.

Yu, Y., et al., "A System for Recognizing a Large Class of Engineering Drawings", IEEE Transactions on Pattern Analysis and Machine Intelligence, Aug. 1997, pp. 868-890, vol. 19, No. 8.

Kasturi, R., et al., "A System for Interpretation of Line Drawings", IEEE Transactions on Pattern Analysis and Machine Intelligence, Oct. 1990, pp. 978-992, vol. 12, No. 10.

Lavirotte, S., et al., "Optical Formula Recognition", Proceedings of the 4th International Conference on Document Analysis and Recognition, Aug. 1997, pp. 357-361.

"Spot Intelligence", https://www.spotintelligence.com/, as downloaded Nov. 12, 2020, pp. 1-6.

"Extract Tables from your PDFs", PDFTron, 2020, https://www.pdftron.com/pdf-tools/pdf-table-extraction/, as downloaded Feb. 17, 2021, pp. 1-2.

"PDFplumber", https://github.com/jsvine/pdfplumber, as downloaded Nov. 12, 2020, pp. 1-20.

Young, B., LinkedIn Video, www.linkedin.com/posts/brett-young-sf_quantitytakeoffsmachinelearning-mepactivity-6584839340420149249-IM_Z, as downloaded Nov. 12, 2020, pp. 1-3.

Stahl, C., et al., "DeepPDF: A Deep Learning Approach to Analyzing PDFs", Oak Ridge National Laboratory, 2018, pp. 1-4.

Llados, J., et al., "Symbol Recognition: Current Advances and Perspectives", Lecture Notes in Computer Science, Sep. 2001, pp. 104-127, vol. 2390.

"How to use Adobe Acrobat Pro's character recognition to make a searchable PDF", https://www.theverge.com/2019/4/18/18484973/adobe-acrobat-pro-character-recognition-searchable-text-pdf, as downloaded Nov. 12, 2020, pp. 1-3.

Ruiz-Montiel, M., et al., "Design with shape grammars and reinforcement learning", Advanced Engineering Informatics, 2013, pp. 230-245, vol. 27.

Groen, F.C.A., et al., "Symbol recognition in electrical diagrams using a probabilistic graph matching", Pattern Recognition Letters, 1985, pp. 343-350, vol. 3.

Dori, D., "A Syntactic/Geometric Approach to Recognition of Dimensions in Engineering Machine Drawings", Computer Vision, Graphics, and Image Processing, 1989, pp. 271-291, vol. 47.

Yadid-Pecht, O., et al., "Recognition of handwritten musical notes by a modified Neocognitron", Machine Vision and Applications, 1996, pp. 65-72, vol. 9.

Anquetil, E., et al., "A Symbol Classifier Able to Reject Wrong Shapes for Document Recognition Systems", Atul K. Chhabra and D. Dori (Eds.): GREC'99, LNCS, 2000, pp. 209-218, vol. 1941.

Fahmy, H., "A graph grammar programming style for recognition of music notation", Machine Vision and Applications, 1993, pp. 83-99, vol. 6.

Llados, J., et al., "A String Based Method to Recognize Symbols and Structural Textures in Architectural Plans", Graphics Recognition: Algorithms and Systems, 1998, pp. 91-103.

Ramel, J-Y, et al., "A Structural Representation Adapted to Handwritten Symbol Recognition", Atul K. Chhabra and D. Dori (Eds.): GREC'99, LNCS 1941, 2000, pp. 228-237.

Bunke, H., "Attributed Programmed Graph Grammars and Their Application to Schematic Diagram Interpretation", IEEE Transactions on Pattern Analysis and Machine Intelligence, Nov. 1982, pp. 574-582, vol. PAMI-4, No. 6.

Lee, H-J., et al., "Understanding Mathematical Expressions Using Procedure-Oriented Transformation", Pattern Recognition, 1994, pp. 447-457, vol. 27, No. 3.

Ablameyko, S., et al., "Knowledge-Based Recognition of Crosshatched Areas in Engineering Drawings", Advances in Pattern Recognition, Aug. 1998, pp. 460-467.

Aoki, Y., et al., "A Prototype System for Interpreting Hand-Sketched Floor Plans", Proceedings of ICPR, 1996, pp. 747-751.

Hamada, A.H., "Structural recognition of disturbed symbols using discrete relaxation", Proceedings of 1st. Int. Conf. on Document Analysis and Recognition, 1991, pp. 170-178.

Per Galle, N.K., "An Algorithm for Exhaustive Generation of Building Floor Plans", Communications of the ACM, Dec. 1981, pp. 813-825, vol. 24, No. 12.

Ah-Soon, C., et al., "Architectural symbol recognition using a network of constraints", Pattern Recognition Letters, 2001, pp. 231-248, vol. 22.

PCT International Search Report & Written Opinion dated Feb. 17, 2021 for PCT Application No. PCT/US20/61096.

* cited by examiner

BUILDING INFORMATION MODEL (BIM) ELEMENT EXTRACTION FROM FLOOR PLAN DRAWINGS USING MACHINE LEARNING

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 62/937,049, filed on Nov. 18, 2019, with inventor(s) Simranjit Singh Kohli, Graceline Caladiao Regala, Yan Fu, Manuel Martinez Alonso, Keith Alfaro, and Emmanuel Gallo, entitled "System to Extract BIM Elements from Floor Plan Drawing Using Machine Learning"; and Provisional Application Ser. No. 62/937,053, filed on Nov. 18, 2019, with inventor(s) Simranjit Singh Kohli, Manuel Martinez Alonso, Keith Alfaro, Emmanuel Gallo, Yan Fu, and Graceline Caladiao Regala, entitled "Synthetic Data Generation Method for Machine Learning Tasks on Floor Plan Drawing".

BACKGROUND OF THE INVENTION

1. Field of the Invention

The present invention relates generally to building information models (BIMs), and in particular, to a method, apparatus, system, and article of manufacture for generating synthetic data and extracting BIM elements from floor plan drawings using machine learning.

2. Description of the Related Art (Note: This application references a number of different publications as indicated throughout the specification by reference names/titles enclosed in brackets, e.g., [Jones]. A list of these different publications ordered according to these reference names/titles can be found below in the section entitled "References." Each of these publications is incorporated by reference herein.)

The automatic conversion of graphical documents to BIM drawings has been a popular research topic. Most prior art systems focus on raster to vector technology. However, currently, many graphical documents are actually in the format of PDF (portable document format) files, which contain richer information for parsing. While graphical drawings may have different types, some of the graphical drawings have consistent patterns that can be used for automatic conversion to BIM elements.

An exemplary graphical drawing is an electrical design drawing. In the architecture design domain, the floor plan electrical design task is usually outsourced to a specialized electrical design company. The delivery from the outsourced company usually consists of PDF files. Although the PDF files contain vectorized information of the electrical symbols, the symbols are not grouped together and there is no semantic information on the vector graph (i.e., of the PDF). As a result, building designers have to manually draft and re-create the electrical symbols inside a building information modelling (BIM) application (e.g., the REVIT application available from the assignee of the present application) while following the electrical drawing PDF files.

To better understand the problems of the prior art, a further description of prior art systems and methods for generating floor plans may be useful.

There are some procedural modeling prior art approaches for floor plan generation. Such prior art systems may be used as candidates of the floor plan outline generation approaches, but they don't address the process of generating an interior design and/or an electrical design of the floor plans. Such prior art systems also cannot control the number of classes or match the design of the particular drawing type ([Camozzato][Lopes]).

Other prior art approaches have been proposed but have limitations that fail to address the problems or provide the efficient and comprehensive solution of embodiments of the present invention. In this regard, Young ([Young]) captures MEP (mechanical, electrical, plumbing) symbols from a PDF, and alternative prior art systems provide a document processing platform that helps businesses extract crucial information from their documents using artificial intelligence techniques. Such systems may use industry-specific taxonomies and domain knowledge to extract the right fields from scanned documents, and analyze larger reports in PDF format ([Spot Intelligence]). PDFtron ([PDFtron]) extracts tables and text from PDF files as XML and HTML by parsing the structure of PDF files. Pdfplumber ([PdfPlumber]) provides an opensource implementation that can be used to extract text, lines, rectangle and tables. Stahl ([Stahl]) uses deep learning and image analysis to create more accurate PDF to text extraction tools. ScienceBeam ([ScienceBeam]) uses computer vision to extract PDF data utilizing a tool to analyze PDF structure and then convert the PDF to xml files. However, these prior art systems fail to provide the advantages and capabilities of embodiments of the invention as set forth below.

Further to the above, some prior art techniques include PDF parsers that relate to PDF analysis but are primarily focused on the text, paragraph content and tables ([Rahul]) or may be based on scanned paper electrical drawings without using deep learning technology [Sebastien])

Additional prior art techniques relate to logic circuit diagrams including symbol recognition in electrical diagrams using probabilistic graph matching [Groen] or structural recognition of disturbed symbols using discrete relaxation [Habacha]. For engineering drawings, prior art methods for symbol recognition primarily use hand-crafted rules or use domain knowledge-based rules (see [Collin], [Don], [Ablameyko], [Dosch], and [Ablameyko2]). Other prior art techniques relate to musical scores as they have a standardized structure and notation, and include extracting staff lines followed by recognizing musical notes using a neural network or feature vector distance (see [Anquetil], [Miyao], [Yadid-Pecht], [Armand], [Randriamahefa], and [Fahmy]). Architectural drawing related prior art systems have many problems and/or limitations. For example, as there is no standardized notation/symbols that appear embedded in documents, segmentation is difficult to separate from the recognition. As a result, graph matching may be used (see [Llad], [Valveny], [Ah-Soon], and [Aoki]).

Some additional academic research relates to logo recognition based on extracting signatures from an image in terms of contour codification or connected component labeling, etc. and then matching the unknown logo with the models in a database using different types of distance or neural networks (see [Bunke], [Yu], and [Kasturi]). Alternative research has investigated formula recognition that uses feature vectors to recognize individual symbols and syntactic approaches to validate the structure of the formula (see [Lavirotte], [Lee], and [Ramel]).

However, all of the above described prior art products/research fail to address the problems of the present invention and/or provide the solutions described herein.

SUMMARY OF THE INVENTION

To reduce the tedious work of drawing design drafting, embodiments of the invention provide a pipeline to automatically parse design drawings using deep learning technology and convert the drawing to building information model (BIM) elements. Firstly, this system automatically identifies a drawing area to exclude certain information (e.g., captions, notes and other areas) so that the following pipeline can focus the recognition and modeling on the drawing area. Then the system not only recognizes floor plan drawing (e.g., electrical) symbols but also extracts geometric and semantic information of the symbols such as symbol labels, orientation and size of the elements for later auto-placement in a BIM model (e.g., the REVIT application).

Further to the above, data scarcity and data privacy are the major limitations for algorithms that involves machine learning strategies. The quality and the precision of the prediction of a machine learning task is directly correlated with size and the relevance of the training dataset it was trained on. Hence, the dataset requires a large amount of training data/samples to successfully learn the target task. The number of classes in the dataset need to be balanced and the training samples must be relevant. In embodiments of the invention, an innovative framework generates synthetic datasets (e.g., to use as the base/foundation of the machine learning model). This framework can be used for any machine learning task related to BIM drawings and can solve problems issued by data scarcity and privacy.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.
Synthetic Floor Plan Drawing Generation When attempting to extract elements from a drawing, embodiments of the invention may utilize machine learning that is based on a model. However, data scarcity for training such a machine learning task/model is problematic (e.g., for floor plan drawings or other types of drawings). More specifically, data scarcity is the major limitation on algorithms that involve machine learning strategies. The quality and the precision of the prediction of a machine learning tasks is directly correlated with the size and the relevance of the training dataset it was trained on. Hence, the dataset requires a large amount of training sample data to successfully learn the target task. In addition, the number of classes in a dataset need to be balanced and the training samples have to be relevant.

Synthetic data generation for other machine learning applications may exist in the prior art. However, the prior art has failed to address the problems associated with floor plan drawings. For example, [Cinnamon] US Patent Application Publication 20190057520 generates 2D images by re-projecting 3D objects. However, [Cinnamon] cannot recreate data that is close and relevant to a customer data or control the number of classes that are present in the dataset. In addition, as described above, there are some prior art procedural modeling approaches for floor plan generation. While such approaches may be used as candidates of the floor plan outline, they don't address the process of generating an interior design and/or an electrical design of the floor plans. Further, such approaches cannot control the number of classes or match the design of the particular drawing type.

Figure 1:
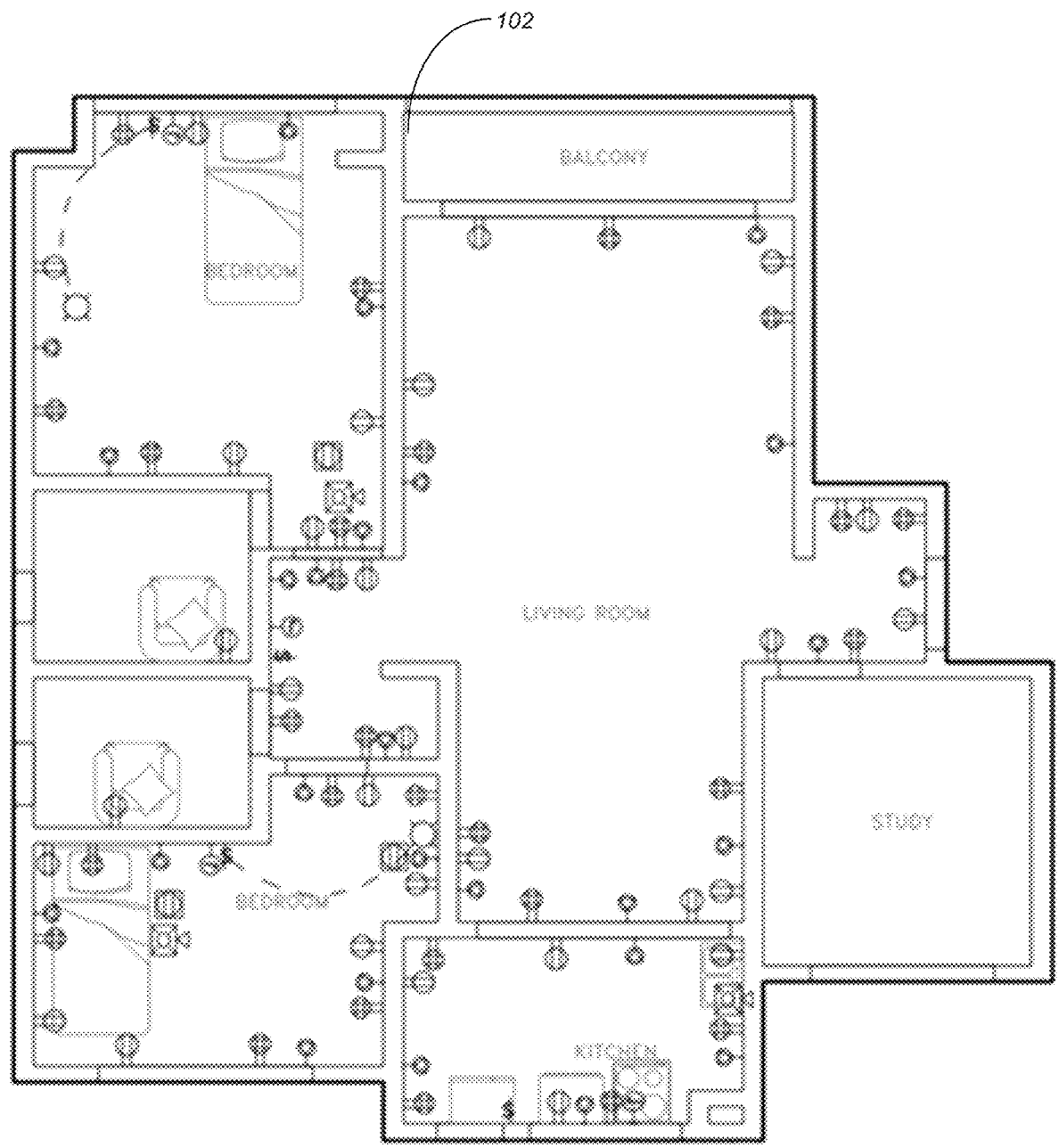
FIG. 1 illustrates an example of a generated synthetic floor plan electrical design drawing in accordance with one or more embodiments of the invention.

To solve the problems of the prior art, embodiments of the invention programmatically generate a (synthetic) dataset. Such synthetic data sets may consist of any architectural floor plan element such as electrical symbols, HVAC, furniture, lighting, etc. The output of the synthetic dataset generation framework can be a layout for a floor plan in vector format (e.g., 2D vector space) or an image (e.g., with the elements). FIG. 1 illustrates an example of a generated synthetic floor plan electrical design drawing 102 in accordance with one or more embodiments of the invention.

Figure 2:
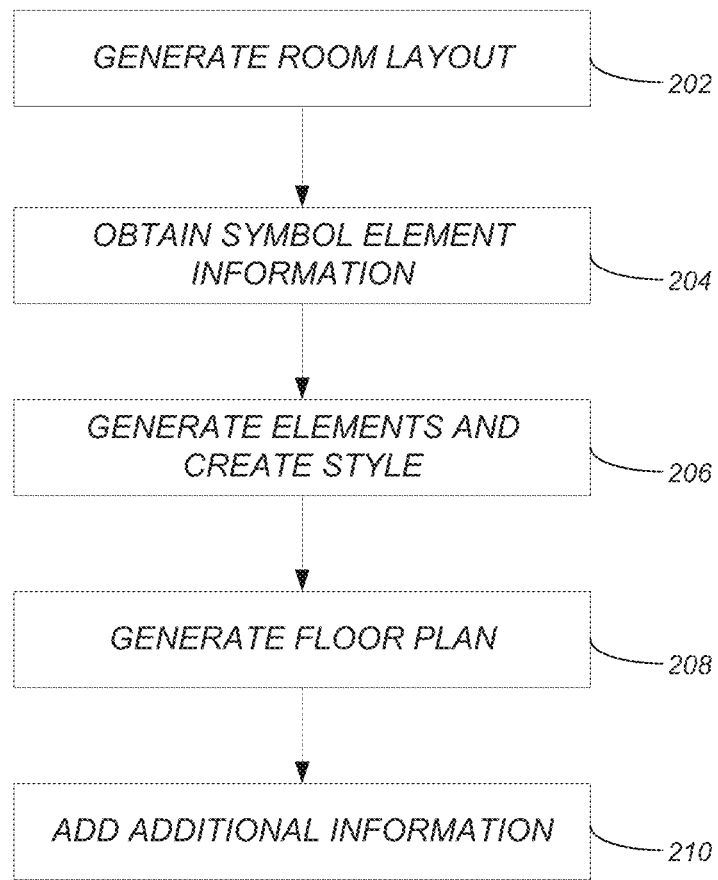
FIG. 2 illustrates the logical flow for generating the synthetic floor plan in accordance with one or more embodiments of the invention.

FIG. 2 illustrates the logical flow for generating the synthetic floor plan in accordance with one or more embodiments of the invention.

At step 202, the algorithm starts to generate the room layout/floorplan in a 2D vector space. The room layout consists of a set of 2D positions that correspond to the beginning and end of all walls and a set of room descriptions that defines the semantic of the room. The room layout can be deduced by/from existing CAD drawings, exhaustively generated (of all possible results) [Per Galle], generated by generative design or created by machine learning algorithms such as GAN (generative adversarial network) [Zheng] or with shape grammars and reinforcement learning [Ruiz-Montiel]. In other words, at step 202, a room layout/floorplan for one or more rooms of a floorplan drawing is obtained (e.g., via one or more different methodologies). Further, in the room layout, a room description defines a semantic for one or more of the rooms.

Figure 3:
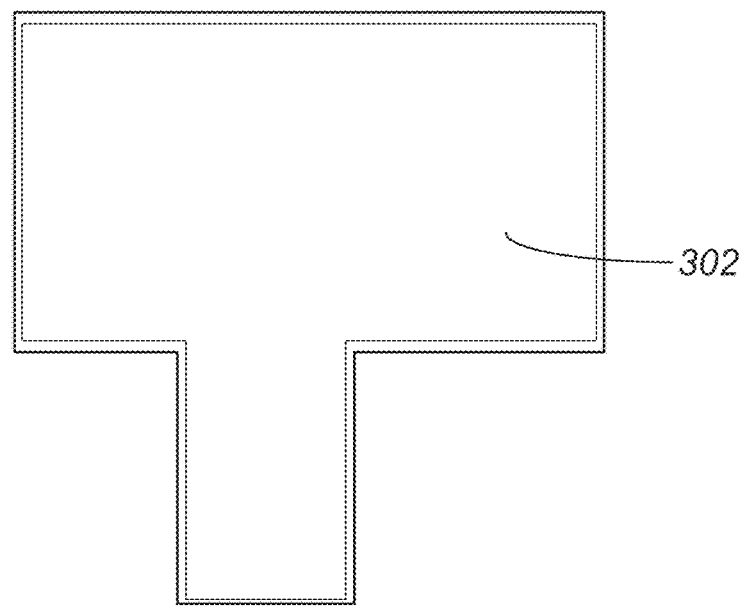
FIG. 3 illustrates an exemplary layout/floorplan that has been generated/obtained in accordance with one or more embodiments of the invention.

FIG. 3 illustrates an exemplary layout/floorplan that has been generated/obtained in accordance with one or more embodiments of the invention. A room layout description of the layout/floorplan 302 may be stored as a JSON (JavaScript Object Notation) file. The file may be composed of a set of floor plans indexed by each floor plan's name (e.g., "scene_02205"). Each floor plan may have two blocks: (1) a set of all the 2D points of the floor plan; and (2) the rooms description that are composed of indices of the 2D points and the semantic label of the room. Table A is a sample floor plan description:

TABLE A

```
{
    "scene_02205": {
        "points": [
            [-4868, -1661],
            [-4868, -5239]
            [-4988, -1541]
            [-4988, -5359]
            [4826, -1661]
            [612, -1661]
            [4946, -1541]
            [732, -1541]
            [-2237, 1308]
            [732, 1308]
            [-2177, 1188]
            [612, 1188]
            [-2117, -1661]
            [-2237, -1541]
            [4826, -5239]
            [4946, -5359]
        ]
        "rooms": [
            [0, 1, 14, 4, 5, 11, 10, 12], "undefined"],
            [7, 9, 8, 13, 2, 3, 15, 6], "outwall"]
        ]
    }
}
```

In Table A, the floor plan "scene_02205" first has the indices for all the points followed by the semantic labels for two (2) rooms: "undefined" and "outwall" (with the numbers representing the indices for each point for/in that room).

Returning to FIG. 2, at step 204, symbol element information for a symbol element is obtained. The symbol element information consists of an enumeration of the rooms in which the symbol element can appear. In this regard, symbols may usually appear in a limited subset of room types. For example, a bathtub may ordinarily only be located within a room type/room labeled as "bathroom" and would not be located in the kitchen. The enumeration specifies/identifies this room type. Further, symbols may often be positioned within a particular location of the room or may be constrained to a particular location (e.g., a toilet or electrical plug is placed against a wall and is usually not located in the middle of the bathroom). Properties/parameters for each symbol identify such attributes for a symbol and may be captured in a configuration file. Thus, for each design, a configuration file may be used to store all of the parameters. The configuration file is composed of several/multiple blocks. Each block is indexed with a unique identifier. Each block corresponds to the rendering of a different symbol element and that element's associated properties. Table B provides an exemplary "Bath" (i.e., bathtub) configuration file block that may be utilized in accordance with one or more embodiments of the invention.

TABLE B

```
"Bath":{
    "path": "symbols/BATH_bath_20.svg",
    "size": 150,
    "angle": 90,
    "room": ["bathroom"],
    "location": "wall",
    "multiple": false,
    "background": true,
    "label": "Bath"
},
```

A configuration file identifies/consists of the following elements:

- the symbol itself that is composed of lines, points, arcs and other possible 2D geometry (i.e., the "path" to the location of the vector image for the symbol),
- the scale of the symbol/symbol element (i.e., "size"). The scale/size corresponds to the size in pixels of the longest edge,
- the orientation related to defined geometry (i.e., "angle") of the symbol/symbol element. The angle is the orientation related to the original symbol,
- the thickness of the 2D geometry (not specified in Table B),
- the enumerations/labels of the room(s) the symbol can appear in (i.e., "room"). In one or more embodiments, the "room" may be a living room, kitchen, bathroom, bedroom, undefined, etc.
- the location inside the room (attached to a "wall", on the "center" of a room or positioned "randomly") (i.e., "location"),
- the number of maximum instances that the symbol/symbol element can appear inside a room (i.e., "multiple") (this could refer to the number on one wall or on all walls),
- a background property identifying whether the symbol/symbol element belongs to (or is part of) the background or the foreground (i.e., "background"). The background and foreground may be painted in different colors and a collision between elements may occur only with elements of the same type.
- the associated label of the symbol/symbol element/block (i.e., "symbol"). Multiple blocks may have the same label and the label may be exported as part of the configuration file along with information for the bounding box of the label.

At step 206, from the description of the room layout, the algorithm generates instances of the symbol elements (also referred to as symbol elements) inside the rooms (based on the room layout and symbol element information) and creates a style for a dataset that can match a design for a customer. As described above, the configuration file may store the symbol element information.

At step 208, the algorithm (randomly) generates the floor plan drawing based on the instances (i.e., that matches the description stored by the configuration files). In this regard, each instance may be randomly calculated until the instance complies with the symbol element information/properties. For instance, the position of each element will be calculated randomly until it meets the description parameters and avoids collisions with other elements. If the location of an element needs to be attached to the wall, the element will be rotated to be perpendicular to the wall. Further, as it may be desirable for the classes to be balanced, a probability of appearance for each element may be maintained and updated each time the element appears. The elements will be generated with possible data augmentation such as scale, crop, color alteration and different line thickness.

At optional step 210, the algorithm may add additional information (e.g., some random text, titles, measurements and links connections between certain elements) to improve the machine learning model. Other symbols that are not of interest for the detection but have a similar appearance as the targeting symbols can also be added as noise symbols so that the machine learning model can learn to distinguish the targeted symbols and the noise symbols.

Figure 4:
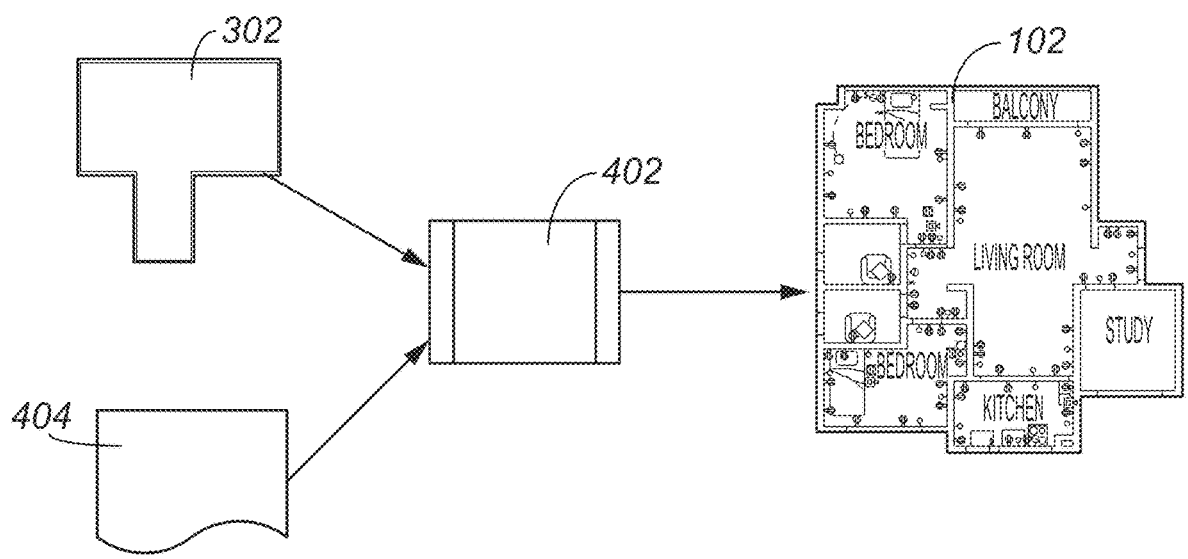
FIG. 4 illustrates an overview of the data flow through the algorithm and processing of FIG. 2 in accordance with one or more embodiments of the invention.

FIG. 4 illustrates an overview of the data flow through the algorithm and processing of FIG. 2 in accordance with one or more embodiments of the invention. In particular, the algorithm/data processing module 402 receives the room layout description 302 and configuration file 404 as input, performs the steps of FIG. 2, and outputs a generated synthetic floor plan 102. The output 102 can be a floor plan in vector format or an image. Further, the parameters/symbols can be found manually or randomly and may be determined using a machine learning algorithm such as GAN that decides if the output design matches the customer data.

Balancing the Symbols

Figure 5:
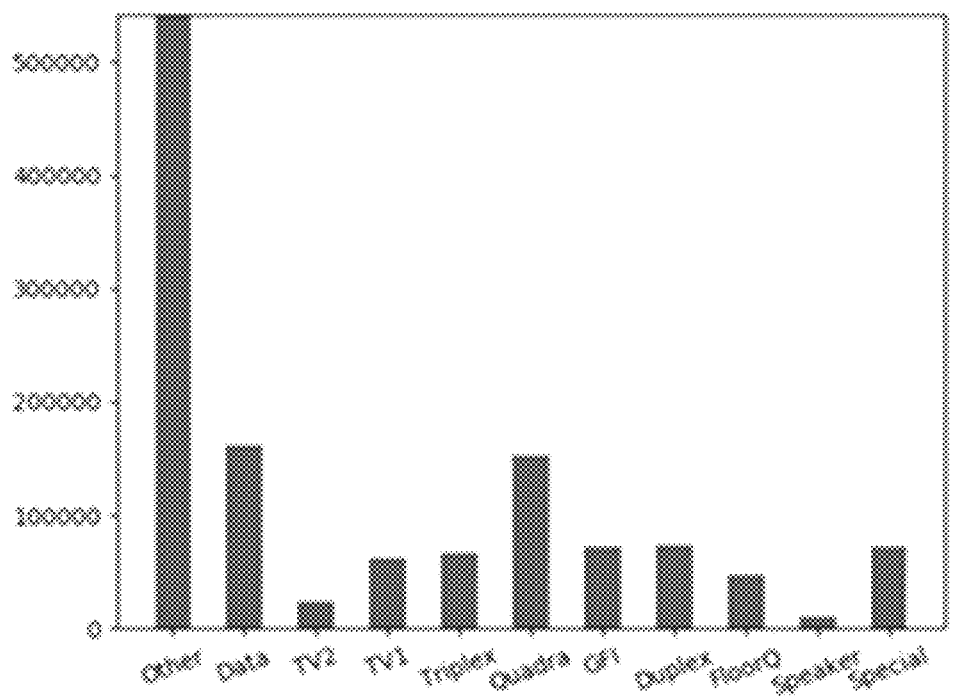
FIG. 5 illustrates a histogram showing the frequency distribution of the different symbols that could potentially result with random selection.

Depending on the configuration of the symbols, if the symbols are randomly put in the floor plan 102, it may cause an unbalanced data issue. FIG. 5 illustrates a histogram showing the frequency distribution of the different symbols that could potentially result with random selection. As illustrated, the "other" symbols have a substantially higher frequency compared to that of the remaining symbols (e.g., Data, TV2, TV1, Triplex, Quadra, GFI, Duplex, FloorQ, Speaker, and Special).

Figure 6:
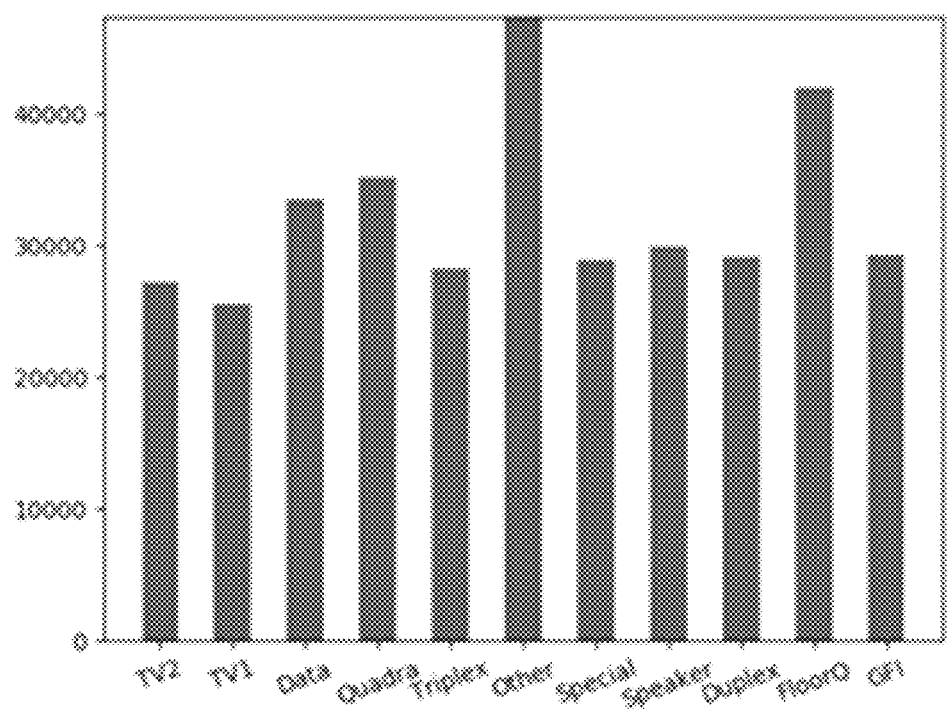
FIG. 6 illustrates a resulting histogram after balancing in accordance with one or more embodiments of the invention.

Accordingly, the floor plan drawing generation step 208 may also include a determination that the instances of the symbol elements in the floor plan drawing are unbalanced. To solve the problem, the floorplan drawing may be triangulated (i.e., into one or more triangles) and then random uniform sampling may be performed inside the triangle to make sure the symbols are placed uniformly inside the floor plan. Moreover, within the triangle, the density of the symbols or the maximum number of the symbols can be controlled to avoid overcrowding in one area. To ensure balanced symbol appearance in a synthetic dataset, a histogram of symbol instances may be maintained and Cumulative Distribution Transform (CDT) may be utilized to control the probability of appearance of the symbols. Such a balancing means that if one type of symbol is over-represented (or under-represented), the weight of this type of symbol may be reduced (or increased) resulting in an increased (or decreased) chance that under-represented symbols are selected during symbol placement. In other words, by adjusting a weight of symbol type, the weight affects how many instances of a symbol type are placed into a drawing floor plan. With these mechanisms, the symbols in the synthetic dataset are much more balanced compared to purely randomly placing the symbols in the floor plan. Further, a balanced dataset may also result in boost/increase of object detection accuracy. FIG. 6 illustrates a resulting histogram after balancing in accordance with one or more embodiments of the invention.

Tile Based Processing

Figure 7A:
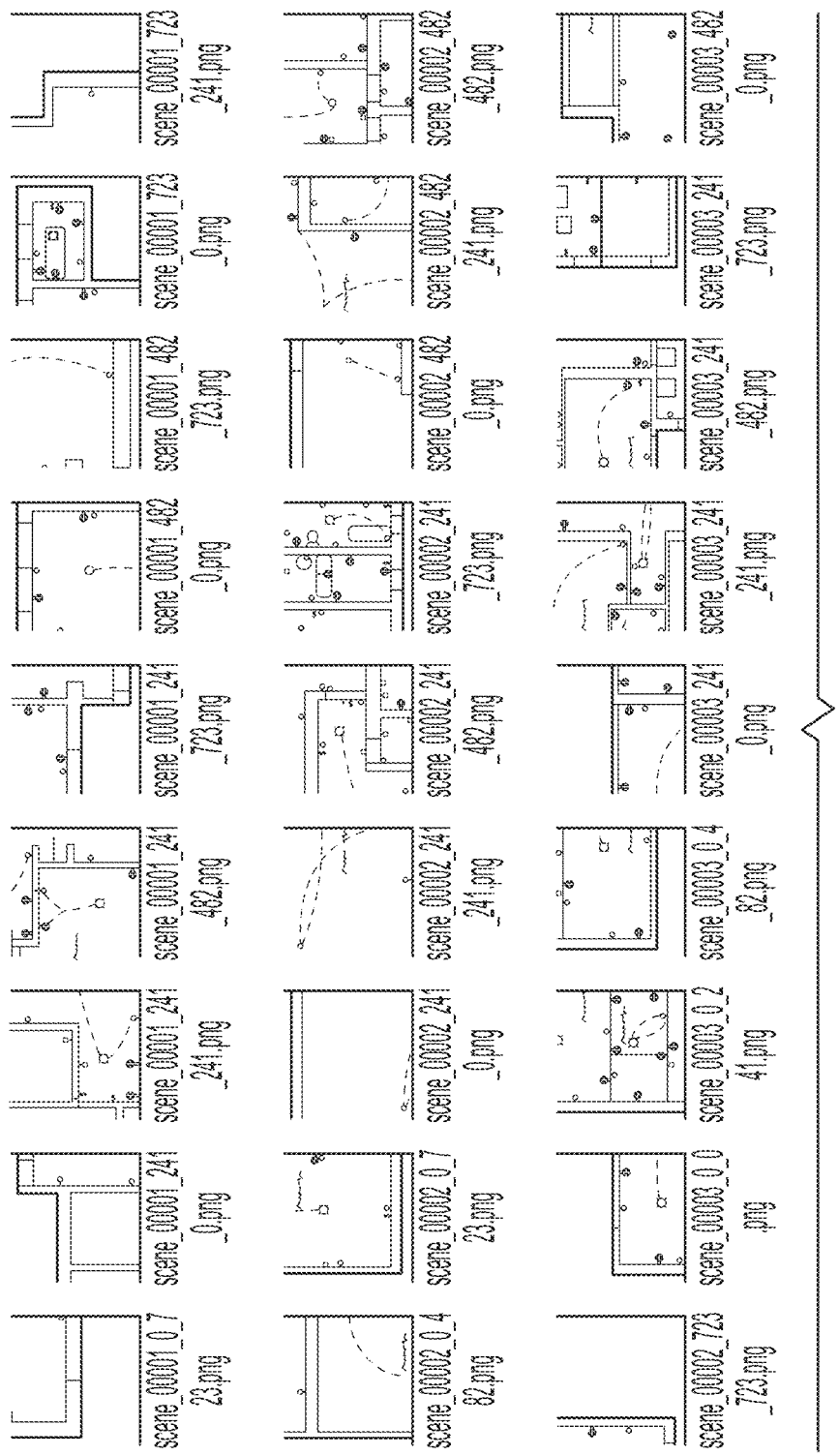
FIGS. 7A and 7B illustrate exemplary tiles that may be generated from the resulting generated synthetic floor plan 102 in accordance with one or more embodiments of the invention.
Figure 7B:
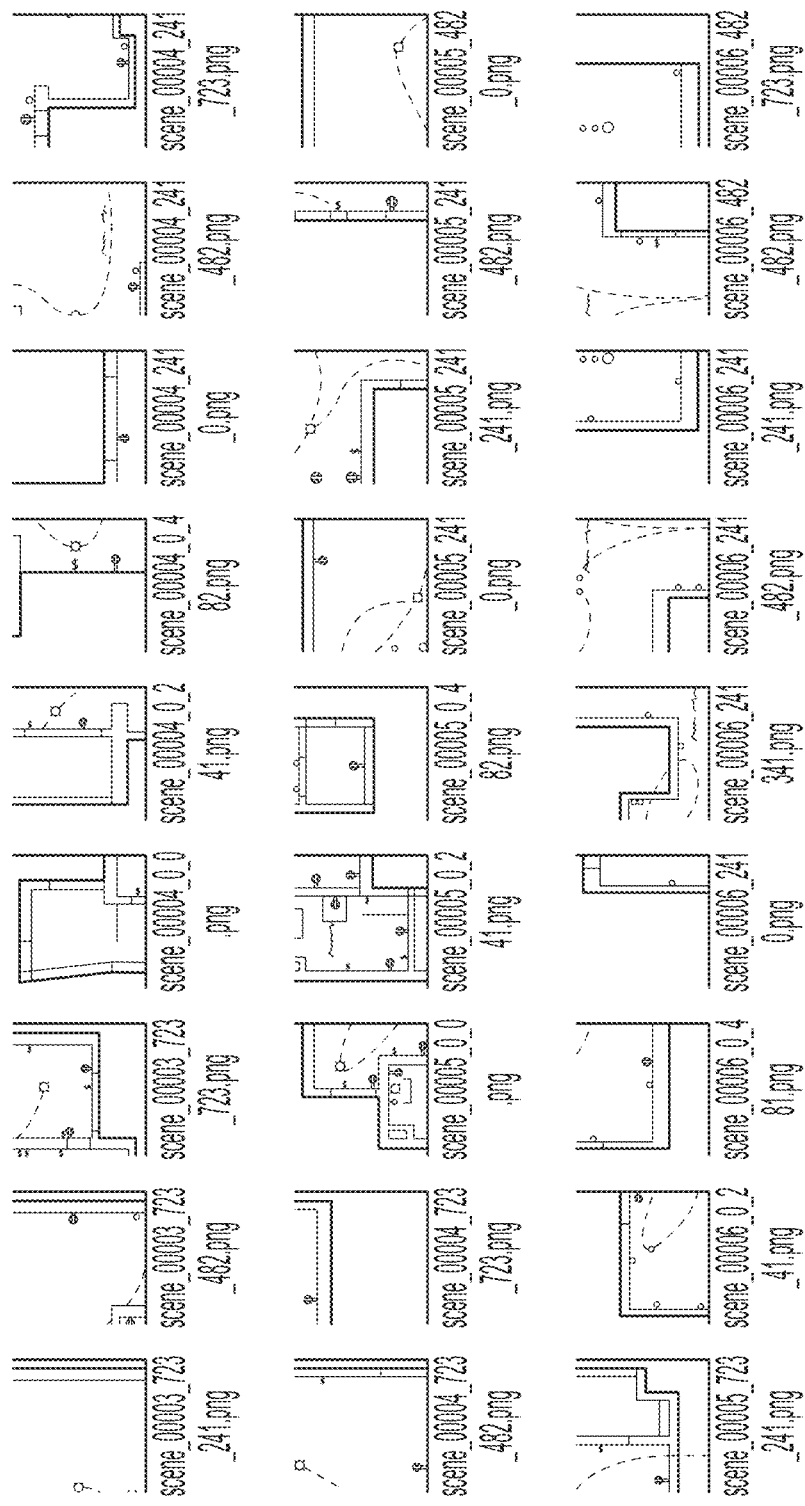

In one or more embodiments of the invention, rather than processing the entire dataset at one time, a floorplan may be broken up into tiles such that a machine learning model is trained one tile at a time. For example, FIGS. 7A and 7B illustrate exemplary tiles that may be generated from the resulting generated synthetic floor plan 102 in accordance with one or more embodiments of the invention. Table C illustrates a corresponding CSV file representing the symbols that are in one tile "scene_00000" (identified in the "image name" column):

TABLE C

| name | xmin | xmax | ymin | ymax | xpos | ypos | Orientation | class_id | image name | Background |
|---|---|---|---|---|---|---|---|---|---|---|
| Duplex | 357 | 372 | 490 | 511 | 372.0825 | 490 | 180 | Duplex | scene_00000 | FALSE |
| Duplex | 55 | 76 | 702 | 716 | 55 | 702.4041 | 90 | Duplex | scene_00000 | FALSE |
| Duplex | 386 | 400 | 835 | 857 | 386.2379 | 857 | 0 | Duplex | scene_00000 | FALSE |
| Duplex | 426 | 448 | 574 | 588 | 448 | 588.7124 | −90 | Duplex | scene_00000 | FALSE |
| Light | 251 | 269 | 655 | 673 | 251.5 | 673.5 | 0 | Light | scene_00000 | FALSE |
| Switch | 263 | 270 | 490 | 507 | 270.4211 | 490 | 180 | Switch | scene_00000 | FALSE |
| Switch | 55 | 72 | 773 | 779 | 55 | 773.3482 | 90 | Switch | scene_00000 | FALSE |
| Switch | 228 | 235 | 839 | 857 | 228.5246 | 857 | 0 | Switch | scene_00000 | FALSE |
| Switch | 430 | 448 | 769 | 775 | 448 | 775.631 | −90 | Switch | scene_00000 | FALSE |
| Duplex | 464 | 485 | 823 | 838 | 464 | 823.9226 | 90 | Duplex | scene_00000 | FALSE |
| Duplex | 568 | 583 | 946 | 968 | 568.8181 | 968 | 0 | Duplex | scene_00000 | FALSE |
| Duplex | 835 | 857 | 478 | 492 | 857 | 492.8121 | −90 | Duplex | scene_00000 | FALSE |
| Duplex | 710 | 724 | 341 | 362 | 724.9363 | 341 | 180 | Duplex | scene_00000 | FALSE |
| Light | 660 | 678 | 709 | 727 | 660.5 | 727 | 0 | Light | scene_00000 | FALSE |
| Switch | 464 | 481 | 885 | 892 | 464 | 885.9448 | 90 | Switch | scene_00000 | FALSE |
| Switch | 607 | 614 | 950 | 968 | 607.6141 | 968 | 0 | Switch | scene_00000 | FALSE |

TABLE C-continued

| name | xmin | xmax | ymin | ymax | xpos | ypos | Orien-tation | class_id | image name | Back-ground |
|---|---|---|---|---|---|---|---|---|---|---|
| Switch | 839 | 857 | 379 | 386 | 857 | 386.3341 | −90 | Switch | scene_00000 | FALSE |
| Switch | 659 | 666 | 341 | 358 | 666.2929 | 341 | 180 | Switch | scene_00000 | FALSE |
| Bath | 861 | 968 | 87 | 131 | 968 | 131.8428 | −90 | Bath | scene_00000 | TRUE |
| Sink_bath | 795 | 837 | 55 | 91 | 837.7813 | 55 | 180 | Sink_bath | scene_00000 | TRUE |
| Toilet | 925 | 968 | 57 | 86 | 968 | 86.87458 | −90 | Toilet | scene_00000 | TRUE |
| Duplex | 946 | 968 | 82 | 97 | 968 | 97.11114 | −90 | Duplex | scene_00000 | FALSE |

As illustrated, the model may be trained one tile at a time. Alternatively (or in addition), all of the tiles may be processed in parallel. The different values provide the position/location (xmin, xmax, ymin, ymax, xpos and ypos) and orientation of the symbol in that row within the tile.

Workflow for Generating a Floor Plan Drawing Using Machine Learning

As described above, in the architecture design domain, the floor plan design task for particular fields (e.g., electrical) is usually outsourced to a specialized third party (e.g., an electrical design company). The delivery from the outsourced company is usually PDF files. Although the PDF files contain vectorized information of the drawing (e.g., electrical) symbols, the symbols are not grouped together grouped together and there is no semantic information on the vector graph. Building designers have to re-create the design symbols (inside a 3D building information modeling application) during drafting by following the drawing PDF files of the outsourced company. To reduce the tedious work of design drafting, embodiments of the invention utilize a pipeline that automatically parses drawing PDF files using deep learning technology and converts the drawing to BIM elements.

In the workflow, the system first automatically identifies a drawing area to exclude certain information (e.g., captions, notes, and other areas) so the pipeline can focus on the recognition and modeling of the drawing area. Embodiments then not only recognize floorplan drawing symbols, but also extract geometric and semantic information of the symbols such as symbol labels, orientation, and size of the symbol elements for later auto-placement via the BIM application.

Figure 8:
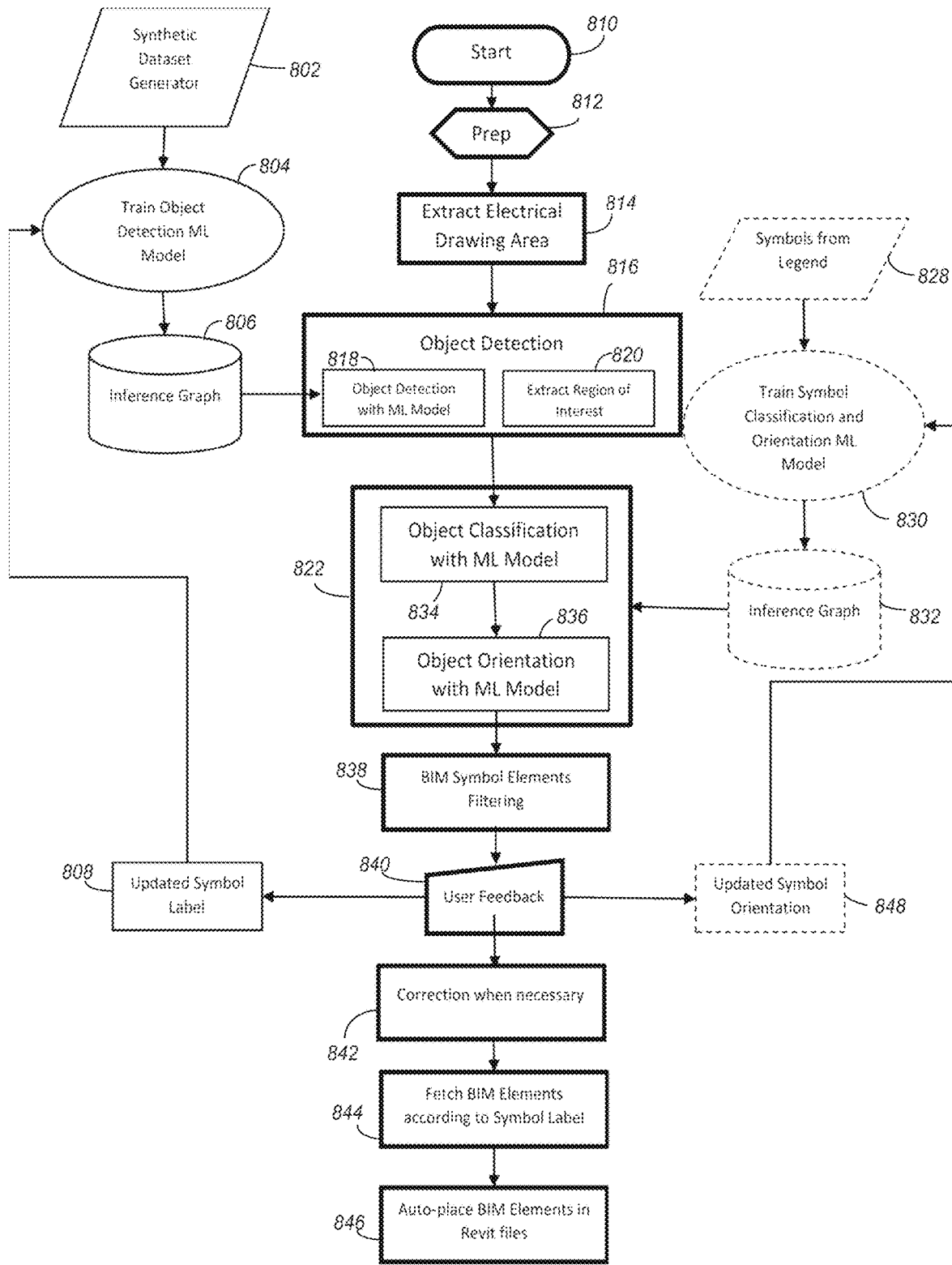
FIG. 8 illustrates the logical flow for generating a floor plan drawing using machine learning in accordance with one or more embodiments of the invention.

FIG. 8 illustrates the logical flow for generating a floor plan drawing using machine learning in accordance with one or more embodiments of the invention. Steps 802-808 relate to the synthetic data generation and use as described above. In particular, the synthetic dataset generator step 802 performs steps 202-210 of FIG. 2 to generate the synthetic data.

At step 804, the object detection machine learning (ML) model is trained based on the synthetic data and the ML model/inference graph 806 may be stored. Further, based on updated symbol labels/information at step 808, the model may be retrained/updated.

The workflow for parsing a design drawing starts at step 810.

A step 812, the PDF drawing is prepared/pre-processed. Since later steps of the workflow are based on object detection in images, the input PDF files may be preprocessed to remove parts of the drawings that are not of interest and to raster the PDF into images for further processing (i.e., the PDF file is converted to a raster image which may be the same format of the synthetic floorplan drawing described above). Accordingly, steps 812-814 provide for obtaining the raster image of the floor plan drawing and may include one or more of the following steps:

Parse the PDF content and remove all text information;
Remove background gridlines with a rule-based method;
Remove background elements using color information; and
Raster the PDF file into images, using the scale ratio information to determine the target resolution.

Automatic Identification of Drawing Area by Parsing PDF Content

At steps 812-814, the (electrical) drawing area to be examined is extracted/determined. In this regard, a drawing area may be automatically/autonomously identified/determined/extracted by parsing the PDF content. As set forth herein, while the figures and text may refer to electrical drawing processing, embodiments of the invention are not limited to electrical drawings and may include processing of any type of design drawing with symbols.

Figure 9:
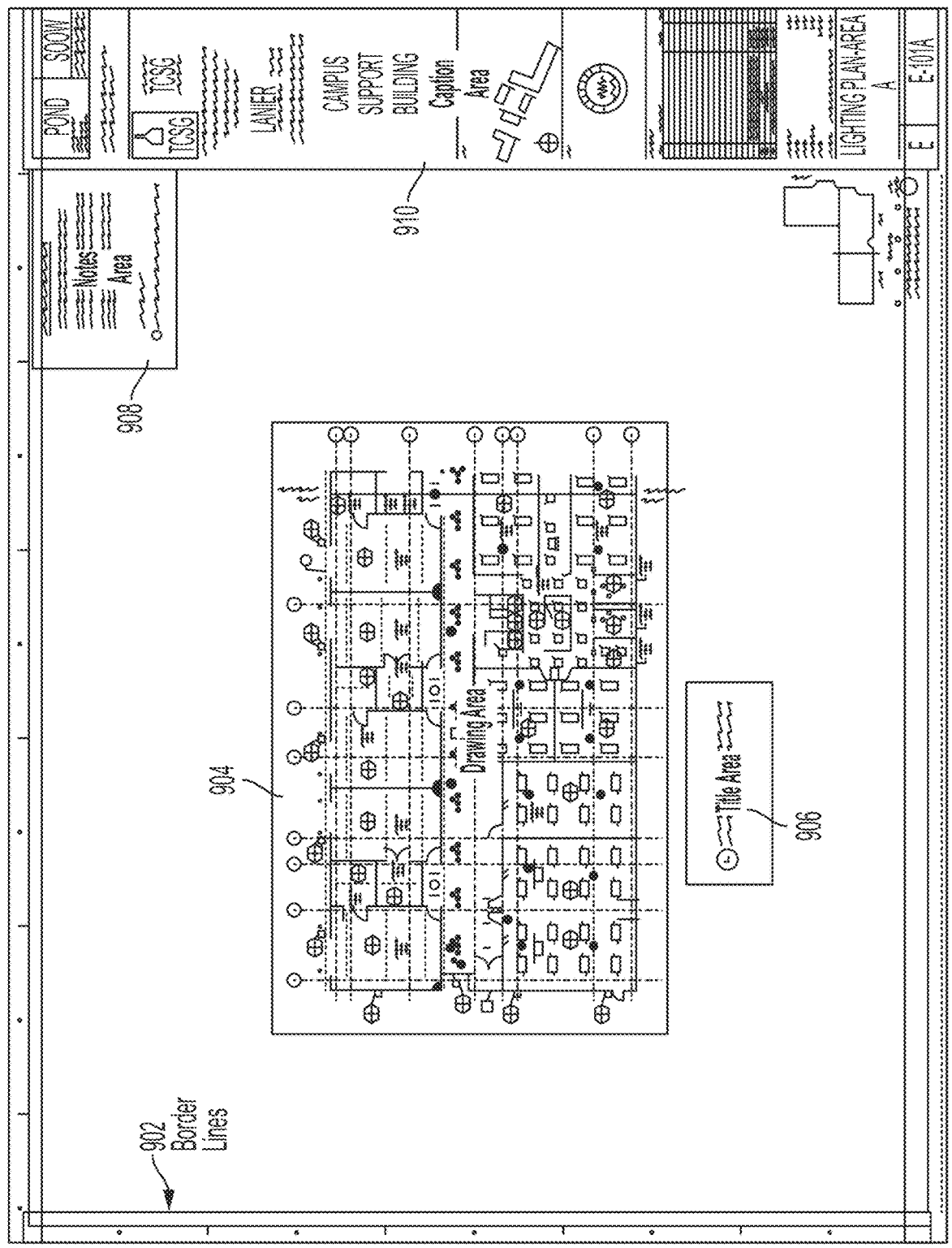
FIG. 9 illustrates the segmentation of a whole graphical drawing page into different sections in accordance with one or more embodiments of the invention.

In design drawings, there may be some fixed patterns on the layout of the drawing, such as the border, caption(s), notes, title, and the real drawing area. Embodiments of the invention are only interested in the drawing area. Accordingly, to focus on the drawing area and to reduce computational overhead, the machine learning model may be trained to segment the rasterized PDF image into multiple sections and only the segments with a particular pattern reflecting the desired drawing area/drawing type (e.g., electrical drawings) will be passed through the pipeline for processing/recognition. FIG. 9 illustrates the segmentation of a whole graphical drawing page into different sections in accordance with one or more embodiments of the invention. As illustrated, the drawing 900 has been segmented into border lines 902, drawing area 904, title area 906, notes area 908, and caption area 910. Only drawing area 904 will be passed onto the pipeline for further processing. The remaining segmented areas 902 and 906-910 are filtered out of the processing).

To summarize step 814 of determining/extracting the drawing area, an ML model may be used to segment the raster image into multiple sections, and the ML model identifies fixed patterns of a layout of the floor plan drawing. Thereafter, the one or more multiple sections that include/define the design drawing area are selected.

Group Elements in the Drawing Area for Region of Interest

Figure 10A:
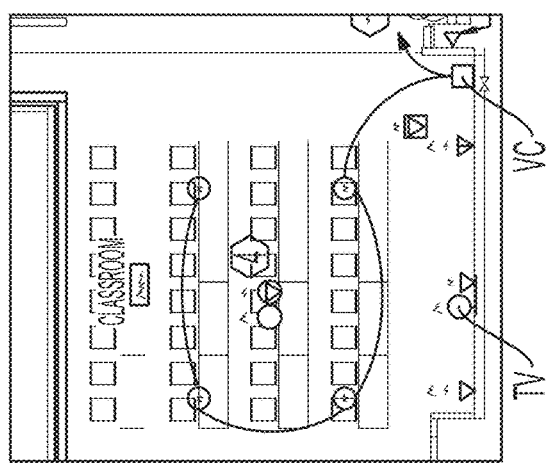
FIG. 10A illustrates a graphic drawing PDF file in accordance with one or more embodiments of the invention.
Figure 10B:
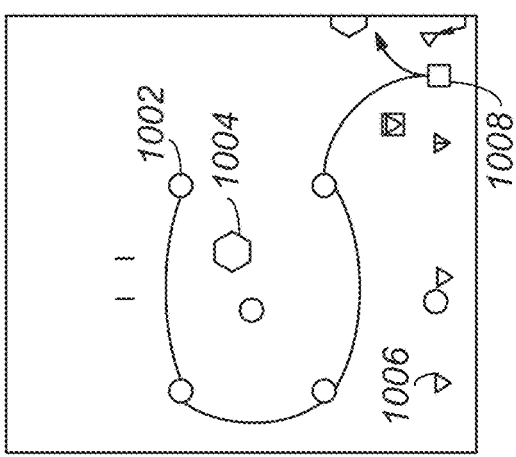
FIG. 10B illustrates the grouping of vectorized elements in accordance with one or more embodiments of the invention.
Figure 10C:
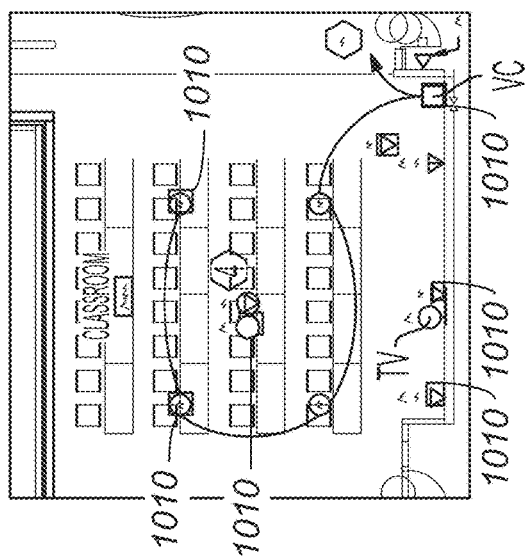
FIG. 10C illustrates the resulting extracted vectorized elements that have bounding boxes in accordance with one or more embodiments of the invention.

Unlike rasterized images, PDFs contain much more meaningful information. By parsing the PDF files, elements such as texts, lines, arcs and rectangles can be obtained from the PDF files. After the drawing area 904 is identified, the vectorized elements inside this area are extracted. The vectorized elements are grouped to form a candidate's area (i.e., a candidate area of candidate elements) for symbol recognition. Candidates/candidate elements can be filtered out by analyzing (i.e., based on) the size of their bounding box. FIGS. 10A-10C illustrate an exemplary group extraction from graphic drawing PDF files in accordance with one or more embodiments of the invention. Each group may be in different color. In this regard, FIG. 10A illustrates a graphic drawing PDF file. In FIG. 10B, vectorized elements 1002, 1004, 1006, 1008 etc. are grouped. FIG. 10C illustrates the resulting extracted vectorized elements that have bounding boxes 1110 (only some bounding boxes are shown for illustration purposes).

Object Recognition and Classification with Models Trained Using Synthetic Drawings Returning to FIG. 8, with the synthetic dataset method generation described above, a synthetic floor plan design drawing dataset (e.g., stored in inference graph 806) can be generated/obtained using the symbol library and synthetic floor plan dataset. Since the design drawing is generated programmatically, the ground truth of the labels and locations of the symbols are already known, reducing the efforts for tedious and erroneous human labeling process. In other words, the synthetic symbol labels, synthetic symbol locations, and synthetic symbol orientations of the synthetic data in the synthetic floor plan design drawing dataset are known.

Figure 11:
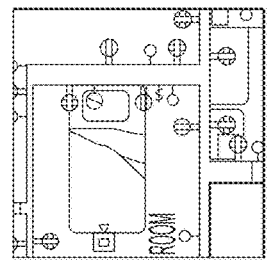
FIG. 11 illustrates a zoomed in view of tiled small images in accordance with one or more embodiments of the invention.
Figure 11:
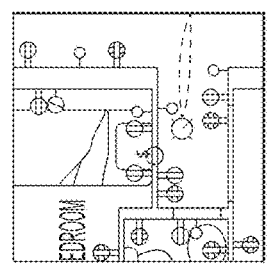
Figure 11:
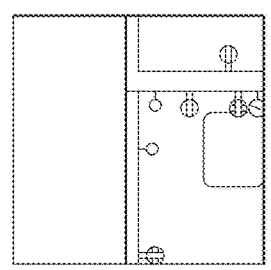
Figure 11:
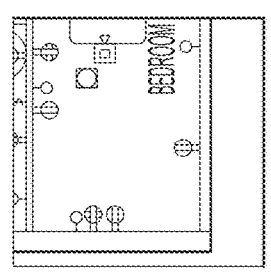
Figure 11:
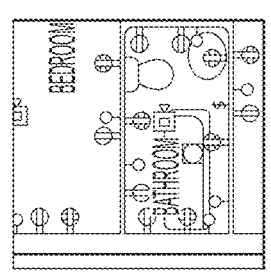

Usually an electrical design drawing is big, but the popular object detection models only take small images as input such as 224*224. As described above, in order to recognize the small symbols inside the big drawing, embodiments of the invention may tile the synthetic electrical drawing images into small tiles (i.e., such as those illustrated in FIGS. 7A and 7B) with fixed dimension so that symbols can be recognized inside that tile when the image is scaled to 224*224 or other low-resolution size. Also, to ensure symbols located at the border of the tiles can also be detected, embodiments may make sure there is overlap between neighboring tiles. The output of the object detection model includes coordinates of the bounding boxes, class/label of the symbol and the confidence score of the detection. FIG. 11 illustrates a zoomed in view of tiled small images (i.e., of the tiles of FIGS. 7A and 7B) with tile size of 300*300 in accordance with one or more embodiments of the invention. Such tiles may be used for the object detection model training as described herein. Thus, the synthetic floor plan design drawing data set may be tiled into multiple tils at are each processed independently (and potentially processed in parallel).

Electrical Symbol Detection Using the Trained Object Detection Model

At step 816, objects in a PDF drawing plan are detected. As described above, the symbol detection will be only applied to the design (e.g., electrical) drawing area 904. To ensure successful detection of the symbols of the target drawing, it is necessary to make sure the size of the symbol in the image to be detected is close to the size of the symbols shown in the training dataset. So, the rasterized images will also be tiled into small tiles with overlaps. At step 818, the trained object detection model (i.e., the ML model/inference graph 806) is used to run through all the small tiles to detect all the symbols (i.e., object detection is performed with the ML model).

As described above, the vector elements in the graphic drawing have been extracted as a region of interest (i.e., at step 820). Symbols resulting from the object detection model that have no overlap with the region of interest will be filtered. Detection with too low a confidence score may also be filtered.

Further, as part of object detection 816, the detection (bounding) boxes may be merged by keeping only the most confident detection (boxes) to make sure there is no overlapping detected symbols in the result. Since the drawing area is cropped from the original PDF file (i.e., the drawing area is extracted at step 814), the symbol detection result also needs to be mapped back to the original PDF using the scale and offset information of the cropped information.

In view of the above, step 816 includes the detection, based on the vectorized elements and synthetic floor plan design drawing dataset, a symbol represented by the vectorized elements (where the symbol/symbol representation includes/consists of a symbol label). Further, a confidence level for the symbol may be determined and evaluated to determine if that confidence level is above/below/within a threshold confidence level. Symbols with confidence levels below the threshold are filtered out while those symbols (i.e., second symbols) with confidence levels above the threshold are retained for further processing.

Determine the Orientation of the Symbols

The object detection model (resulting from object detection 820) only gives the size and the type of the bounding boxes, but the orientation of the symbol is still missing, which makes the automatic symbol placement difficult. Step 822 provides for determining (based on the synthetic floor plan design drawing dataset) this orientation.

From the object detection 816, there are already a lot of symbol instances inside the floor plan images generated through the synthetic dataset (in inference graph 806) and the orientation of the synthetic symbols are already known, such orientation information can be used for orientation information learning. Thus, at step 830, the known symbols orientation (in the synthetic floor plan design drawing dataset), another machine learning model 832 (i.e., the symbol classification and orientation ML model) is trained to predict the orientation of the detected symbols. The training at step 830 utilizes the symbols from a symbol legend 828 to generate the symbol classification and orientation ML model that is then stored in and accessed via database/inference graph 832.

Once the model has been generated/trained, step 822 may be performed to actually use the model to determine the orientation of the symbols in a drawing. In step 834, since the orientation of the symbols are usually aligned with wall directions, there are limited directions for the symbols—e.g., four (4) directions (left, right, up, down) or more detailed 360-degree directions. Thus, it is enough to use a classification model (at step 834) as well as the object orientation model (at step 836) for symbol orientation prediction. For example, the nearest wall of the detected symbols can also be queried in the floor plan drawing and the direction of the wall can be used to further validate the predicted orientation. Accordingly, at step 822, the orientation of the object symbol instances is determined based on the ML model trained in step 830.

The object detection at step 816 and object orientation at step 822 are both based on one or more ML models (e.g., the detection ML model and the symbol classification and orientation ML model [also referred to as the symbol orientation classification model]). However, such ML models may produce output with varying levels of confidence. For example, the ML models may detect a particular symbol or orientation with a 25% level of confidence/accuracy or another symbol with a 75% level of confidence/accuracy (e.g., based on unknown graphics, missing data, or other issues during the detecting/orienting).

At step 838, BIM symbol elements may be filtered. Such a filtering may be based on domain knowledge and/or errors/low confidence in detection/orientation output. For example, domain knowledge may be used to determine that if a bathtub is located in a kitchen, or a duplex/light switch is not attached to a wall, it does not make sense. Accordingly, at step 838, such errors or low confidence predictions may be filtered out. In this regard, a confidence threshold level may be defined and used to determine the level of confidence/accuracy that is tolerable (e.g., a user may adjust the threshold level or it may be predefined within the system). Of note, is that filtering step 838 may be performed at multiple locations (e.g., at the current location in the flow of FIG. 8 or after further steps are performed).

User Interaction to Provide Feedback and Refine the Object Detection Model

After the orientation is determined (i.e., at step 822) and symbol element filtering is performed at step 838, user interaction may be provided to obtained feedback and refine the object detection model at step 840. In this regard, the floor plan drawing with the placed BIM elements may be presented to the user. For example, the filtered and detected symbols may be presented to the user with different colors for different levels of confidence. User feedback is then received. In addition, users may adjust the confidence threshold to filter out some detection. Based on the user feedback at step 840, labels, orientation or other information may be corrected as necessary at step 842. In this regard, users may also fine tune the bounding boxes of the detected symbols and correct the wrong labels of some symbols. User feedback may also update the symbol orientation. The user's feedback (i.e., the updated symbol labels 808 and updated symbol orientations 848 can be treated as a ground-truth and can be used to retrain object detection model (i.e., at step 804) and the symbol orientation classification model (i.e., at step 830).

Figure 12:
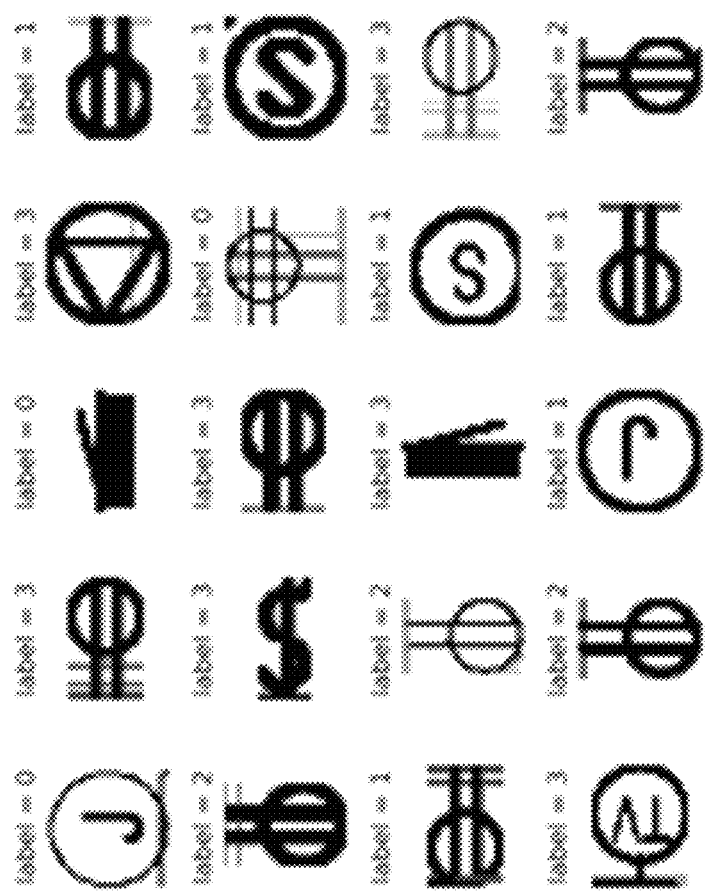
FIG. 12 illustrates a prediction of exemplary electrical symbols in accordance with one or more embodiments of the invention.

After the orientation is determined, BIM elements (e.g., electrical BIM elements) are automatically/autonomously extracted/fetched according to symbol object label at step 844. FIG. 12 illustrates a prediction of exemplary electrical symbols (also referred to as the symbol orientation classification) with four (4) labels in accordance with one or more embodiments of the invention. As illustrated the four (4) labels are label=0, label=1, label=2, and label=3. The fetching step 844 of BIM elements essentially provides for fetching a BIM 3D element that corresponds to the 2D symbols detected, oriented, filtered, and adjusted (i.e., in steps 816, 822, 838, and 842). In this regard, based on the classification of the symbol (determined at step 834), there is a one-to-one (1-to-1) mapping to a BIM element for that class. Accordingly, based on the symbol label/classification at step 844, the appropriate BIM element can be fetched.

Figure 13:
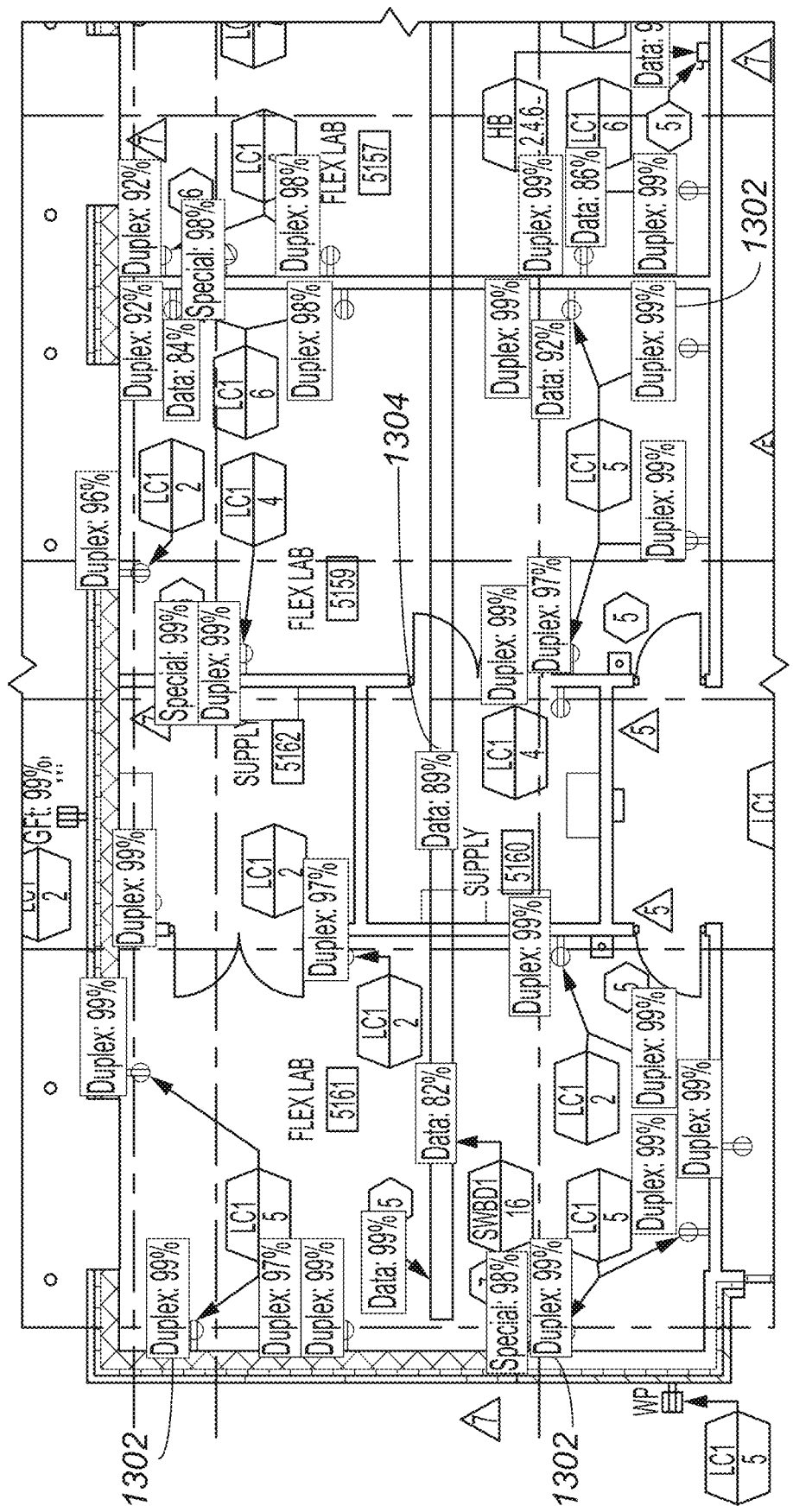
FIG. 13 illustrates a resulting floor plan drawing displayed to a user with symbols that have been placed in accordance with one or more embodiments of the invention.

At step 846, the (electrical) symbols are automatically/autonomously placed in the floor plan drawing (e.g., in accordance with the extracted size and orientation information). FIG. 13 illustrates a resulting floor plan drawing displayed to a user with symbols that have been placed in accordance with one or more embodiments of the invention. As illustrated, adjacent to the graphic/icon for each placed symbol is the label for that symbol as well as the level of accuracy/confidence for that symbol (e.g., duplex: 99% 1302, data 89% 1304, etc.). The labels for different classes of elements/symbols may be displayed in different colors (or in a pattern that is differentiable) (e.g., duplex may be displayed in green while data may be displayed in light blue). At this stage, additional user feedback 840 may also be obtained and used to retrain the models as described above.

Hardware Environment

Figure 14:
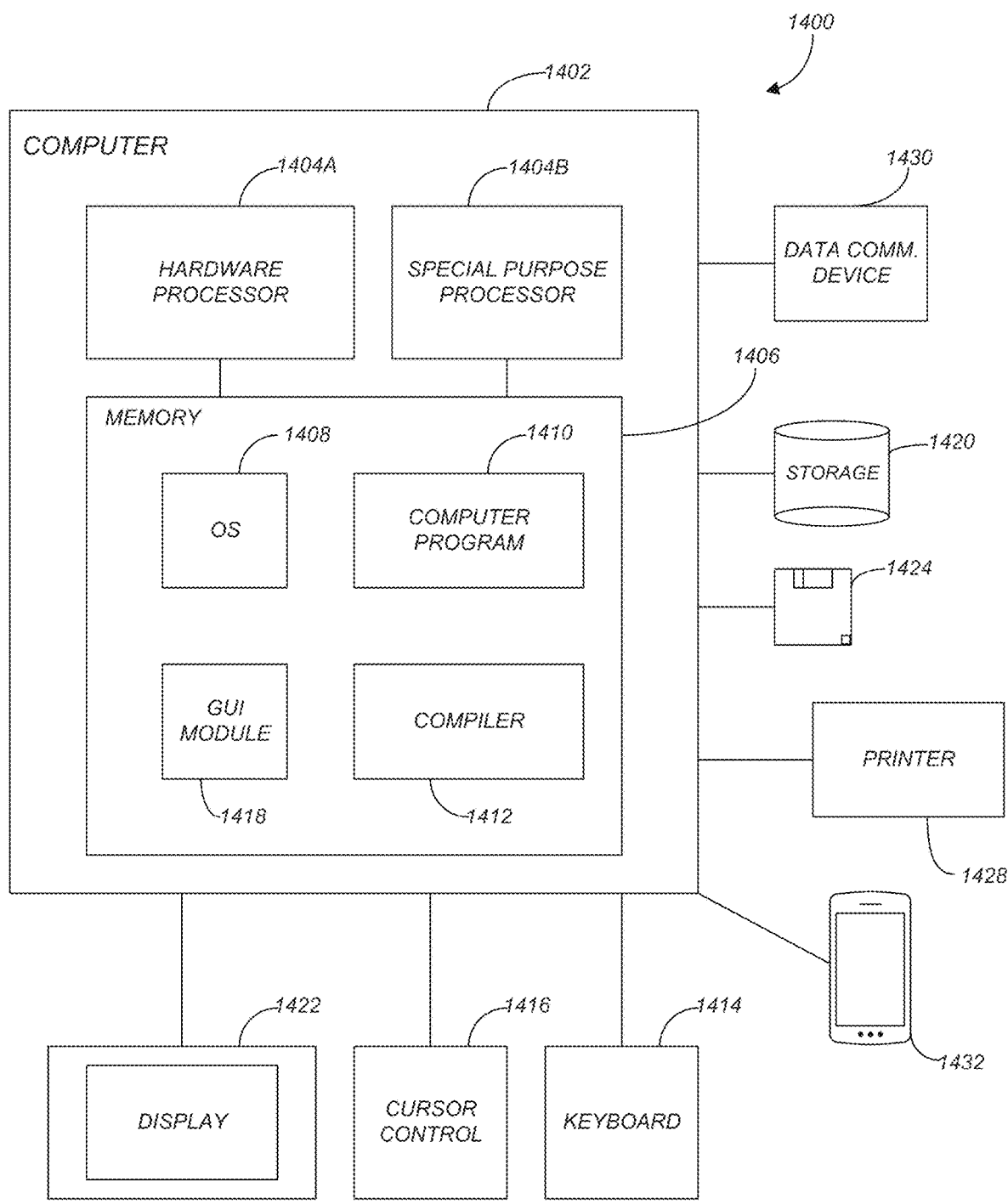
FIG. 14 is an exemplary hardware and software environment used to implement one or more embodiments of the invention.

FIG. 14 is an exemplary hardware and software environment 1400 (referred to as a computer-implemented system and/or computer-implemented method) used to implement one or more embodiments of the invention. The hardware and software environment includes a computer 1402 and may include peripherals. Computer 1402 may be a user/client computer, server computer, or may be a database computer. The computer 1402 comprises a hardware processor 1404A and/or a special purpose hardware processor 1404B (hereinafter alternatively collectively referred to as processor 1404) and a memory 1406, such as random access memory (RAM). The computer 1402 may be coupled to, and/or integrated with, other devices, including input/output (I/O) devices such as a keyboard 1414, a cursor control device 1416 (e.g., a mouse, a pointing device, pen and tablet, touch screen, multi-touch device, etc.) and a printer 1428. In one or more embodiments, computer 1402 may be coupled to, or may comprise, a portable or media viewing/listening device 1432 (e.g., an MP3 player, IPOD, NOOK, portable digital video player, cellular device, personal digital assistant, etc.). In yet another embodiment, the computer 1402 may comprise a multi-touch device, mobile phone, gaming system, internet enabled television, television set top box, or other internet enabled device executing on various platforms and operating systems.

In one embodiment, the computer 1402 operates by the hardware processor 1404A performing instructions defined by the computer program 1410 (e.g., a computer-aided design [CAD] application) under control of an operating system 1408. The computer program 1410 and/or the operating system 1408 may be stored in the memory 1406 and may interface with the user and/or other devices to accept input and commands and, based on such input and commands and the instructions defined by the computer program 1410 and operating system 1408, to provide output and results.

Output/results may be presented on the display 1422 or provided to another device for presentation or further processing or action. In one embodiment, the display 1422 comprises a liquid crystal display (LCD) having a plurality of separately addressable liquid crystals. Alternatively, the display 1422 may comprise a light emitting diode (LED) display having clusters of red, green and blue diodes driven together to form full-color pixels. Each liquid crystal or pixel of the display 1422 changes to an opaque or translucent state to form a part of the image on the display in response to the data or information generated by the processor 1404 from the application of the instructions of the computer program 1410 and/or operating system 1408 to the input and commands. The image may be provided through a graphical user interface (GUI) module 1418. Although the GUI module 1418 is depicted as a separate module, the instructions performing the GUI functions can be resident or distributed in the operating system 1408, the computer program 1410, or implemented with special purpose memory and processors.

In one or more embodiments, the display 1422 is integrated with/into the computer 1402 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD, SURFACE Devices, etc.), portable/handheld game/music/video player/console devices (e.g., IPOD TOUCH, MP3 players, NINTENDO SWITCH, PLAYSTATION PORTABLE, etc.), touch tables, and walls (e.g., where an image is projected through acrylic and/or glass, and the image is then backlit with LEDs).

Some or all of the operations performed by the computer 1402 according to the computer program 1410 instructions may be implemented in a special purpose processor 1404B.

In this embodiment, some or all of the computer program 1410 instructions may be implemented via firmware instructions stored in a read only memory (ROM), a programmable read only memory (PROM) or flash memory within the special purpose processor 1404B or in memory 1406. The special purpose processor 1404B may also be hardwired through circuit design to perform some or all of the operations to implement the present invention. Further, the special purpose processor 1404B may be a hybrid processor, which includes dedicated circuitry for performing a subset of functions, and other circuits for performing more general functions such as responding to computer program 1410 instructions. In one embodiment, the special purpose processor 1404B is an application specific integrated circuit (ASIC).

The computer 1402 may also implement a compiler 1412 that allows an application or computer program 1410 written in a programming language such as C, C++, Assembly, SQL, PYTHON, PROLOG, MATLAB, RUBY, RAILS, HASKELL, or other language to be translated into processor 1404 readable code. Alternatively, the compiler 1412 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 1410 accesses and manipulates data accepted from I/O devices and stored in the memory 1406 of the computer 1402 using the relationships and logic that were generated using the compiler 1412.

The computer 1402 also optionally comprises an external communication device such as a modem, satellite link, Ethernet card, or other device for accepting input from, and providing output to, other computers 1402.

In one embodiment, instructions implementing the operating system 1408, the computer program 1410, and the compiler 1412 are tangibly embodied in a non-transitory computer-readable medium, e.g., data storage device 1420, which could include one or more fixed or removable data storage devices, such as a zip drive, floppy disc drive 1424, hard drive, CD-ROM drive, tape drive, etc. Further, the operating system 1408 and the computer program 1410 are comprised of computer program 1410 instructions which, when accessed, read and executed by the computer 1402, cause the computer 1402 to perform the steps necessary to implement and/or use the present invention or to load the program of instructions into a memory 1406, thus creating a special purpose data structure causing the computer 1402 to operate as a specially programmed computer executing the method steps described herein. Computer program 1410 and/or operating instructions may also be tangibly embodied in memory 1406 and/or data communications devices 1430, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1402.

Figure 15:
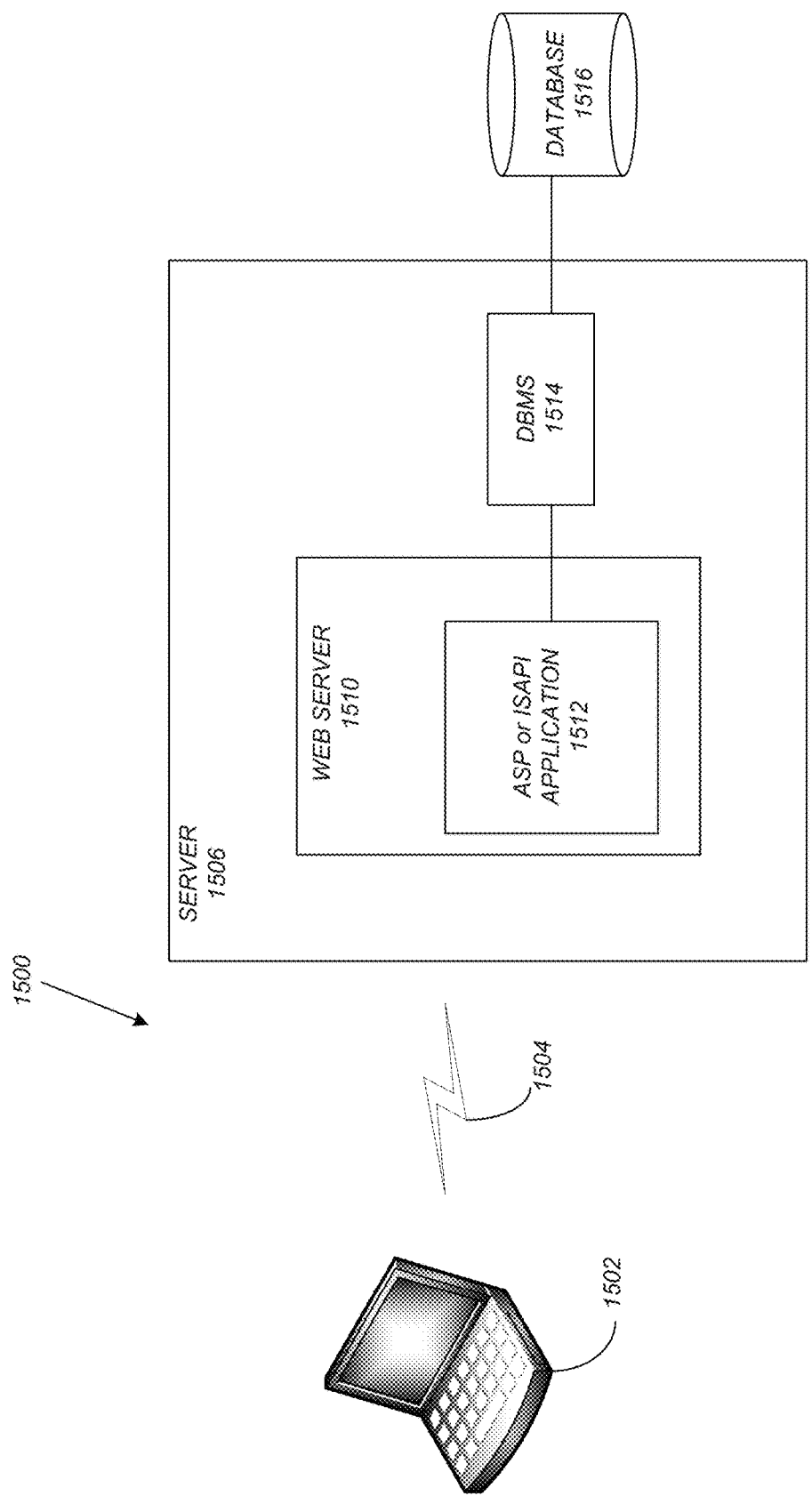
FIG. 15 schematically illustrates a typical distributed/cloud-based computer system in accordance with one or more embodiments of the invention.

FIG. 15 schematically illustrates a typical distributed/cloud-based computer system 1500 using a network 1504 to connect client computers 1502 to server computers 1506. A typical combination of resources may include a network 1504 comprising the Internet, LANs (local area networks), WANs (wide area networks), SNA (systems network architecture) networks, or the like, clients 1502 that are personal computers or workstations (as set forth in FIG. 14), and servers 1506 that are personal computers, workstations, minicomputers, or mainframes (as set forth in FIG. 14). However, it may be noted that different networks such as a cellular network (e.g., GSM [global system for mobile communications] or otherwise), a satellite based network, or any other type of network may be used to connect clients 1502 and servers 1506 in accordance with embodiments of the invention.

A network 1504 such as the Internet connects clients 1502 to server computers 1506. Network 1504 may utilize ethernet, coaxial cable, wireless communications, radio frequency (RF), etc. to connect and provide the communication between clients 1502 and servers 1506. Further, in a cloud-based computing system, resources (e.g., storage, processors, applications, memory, infrastructure, etc.) in clients 1502 and server computers 1506 may be shared by clients 1502, server computers 1506, and users across one or more networks. Resources may be shared by multiple users and can be dynamically reallocated per demand. In this regard, cloud computing may be referred to as a model for enabling access to a shared pool of configurable computing resources.

Clients 1502 may execute a client application or web browser and communicate with server computers 1506 executing web servers 1510. Such a web browser is typically a program such as MICROSOFT INTERNET EXPLORER/ EDGE, MOZILLA FIREFOX, OPERA, APPLE SAFARI, GOOGLE CHROME, etc. Further, the software executing on clients 1502 may be downloaded from server computer 1506 to client computers 1502 and installed as a plug-in or ACTIVEX control of a web browser. Accordingly, clients 1502 may utilize ACTIVEX components/component object model (COM) or distributed COM (DCOM) components to provide a user interface on a display of client 1502. The web server 1510 is typically a program such as MICROSOFT'S INTERNET
Information Server.

Web server 1510 may host an Active Server Page (ASP) or Internet Server Application Programming Interface (ISAPI) application 1512, which may be executing scripts. The scripts invoke objects that execute business logic (referred to as business objects). The business objects then manipulate data in database 1516 through a database management system (DBMS) 1514. Alternatively, database 1516 may be part of, or connected directly to, client 1502 instead of communicating/obtaining the information from database 1516 across network 1504. When a developer encapsulates the business functionality into objects, the system may be referred to as a component object model (COM) system. Accordingly, the scripts executing on web server 1510 (and/or application 1512) invoke COM objects that implement the business logic. Further, server 1506 may utilize MICROSOFT'S TRANSACTION SERVER (MTS) to access required data stored in database 1516 via an interface such as ADO (Active Data Objects), OLE DB (Object Linking and Embedding DataBase), or ODBC (Open DataBase Connectivity).

Generally, these components 1500-1516 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/ or data, when read, executed, and/or interpreted, results in the steps necessary to implement and/or use the present invention being performed.

Although the terms "user computer", "client computer", and/or "server computer" are referred to herein, it is understood that such computers 1502 and 1506 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1502 and 1506. Embodiments of the invention are implemented as a software/CAD application on a client 1502 or server computer 1506. Further, as described above, the client 1502 or server computer 1506 may comprise a thin client device or a portable device that has a multi-touch-based display.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[Per Galle] Per Galle. "An algorithm for exhaustive generation of building floor plans". In: Communications of the ACM 24.12 (1981), pp. 813-825.

[Zheng] Hao Zheng, Weixin Huang. 2018. "Architectural Drawings Recognition and Generation through Machine Learning". Cambridge, Mass., ACADIA.

[Ruiz-Montiel] Manuela Ruiz-Montiel, Javier Boned, Juan Gavilanes, Eduardo Jimenez, Lawrence Mandow, Jose-Luis Perez-de-la-Cruz: Design with shape grammars and reinforcement learning. Advanced Engineering Informatics 27(2): 230-245 (2013).

[Camozzato] Camozzato, Daniel. "A METHOD FOR GROWTH-BASED PROCEDURAL FLOOR PLAN GENERATION." (2015).

[Lopes] Lopes, Tutenel, Smelik, deKraker, and Bidarra "A Constrained Growth Method for Procedural Floor Plan Generation", Proceedings of GAME-ON 2010 (November 2010).

[Young] www.linkedin.com/posts/brett-young-sf_quantitytakeoffs-machinelearning-mep-activitiy-6584839340420149249-IM_Z LinkedIn Video by Brett Young (2019).

[Spot Intelligence] www.spotintelligence.com.

[PDFtron] "Extract Tables from Your PDFs", PDFTron SDK, 2020.

[PDFplumber] "pdfplumber", Github 2020.

[Stahl] Stahl, Christopher G., Young, Steven R., Herrmannova, Drahomira, Patton, Robert M., and Wells, Jack C. *DeepPDF: A Deep Learning Approach to Extracting Text from PDFs*. United States: N. p., 2018. Web.

[Ecer] Ecer, Daniel, and Maciocci, Giuliano. *ScienceBeam—using computer vision to extract PDF data*. (Aug. 4, 2017).

[Rahul] Rahul, R., Paliwal, S., Sharma M., and Vig, L. *Automatic Information Extraction from Piping and Instrumentation Diagrams* (Jan. 28, 2019).

[Sebastien] Sébastien Adam, Jean-Marc Ogier, Claude Cariou, Remy Mullot, Jacques Labiche, et al. Symbol and character recognition: application to engineering drawings. IJDAR, 2000, 3 (2), pp. 89-101. ha100439443.

[Groen] Groen, F., Sanderson, A., Schlag, F.: Symbol recognition in electrical diagrams using a probabilistic graph matching. PRL 3 (1985) 343-350.

[Habacha] Habacha, A.: Structural recognition of disturbed symbols using discrete relaxation. In: Proceedings of 1st. Int. Conf. on Document Analysis and Recognition. (1991) 170-178 Saint Malo, France.

[Collin] Collin, S., Colnet, D.: Syntactic analysis of technical drawing dimensions. Int. Journal of Pattern Recognition and Artificial Intelligence 8 (1994) 1131-1148. 106, 107, 112, 126.

[Dori] Dori, D.: A syntactic/geometric approach to recognition of dimensions in engineering machine drawings. Computer Vision, Graphics and Image Processing 47 (1989) 271-291. 107, 112, 126.

[Ablameyko] Ablameyko, S.: An Introduction to Interpretation of Graphic Images. SPIE Optical Engineering Press (1997).

[Dosch] Dosch, P., Masini, G., Tombre, K.: Improving arc detection in graphics recognition. In: Proceedings of 15th. Int. Conf. on Pattern Recognition. Volume 2. (2000) 243-246 Barcelona, Spain. 106.

[Ablameyko2] Ablameyko, S., Bereishik, V., Frantskevich, O., Homenko, M., Paramonova, N.: Knowledge-based recognition of crosshatched areas in engineering drawings. In Amin, A., Dori, D., Pudil, P., Freeman, H., eds.: Advances in Pattern Recognition. Vol. 1451 of LNCS (1998) 460-467.

[Anquetil] Anquetil, E., Co"uasnon, B., Dambreville, F.: A symbol classifier able to reject wrong shapes for document recognition systems. In Chhabra, A., Dori, D., eds.: Graphics Recognition—Recent Advances. Springer, Berlin (2000) 209-218 Vol. 1941 of LNCS.

[Miyao] Miyao, H., Nakano, Y.: Note symbol extraction for printed piano scores using neural networks. IEICE Trans. Inf. and Syst. E79-D (1996) 548-553.

[Yadid-Pecht] Yadid-Pecht, O., Gerner, M., Dvir, L., Brutman, E., Shimony, U.: Recognition of handwritten musical notes by a modified neocognitron. Machine Vision and Applications 9 (1996) 65-72.107, 110, 128.

[Armand] Armand, J.: Musical score recognition: a hierarchical and recursive approach. In: Proceedings of Second IAPR Int. Conf. on Document Analysis and Recognition, ICDAR'93. (1993) 906-909 Tsukuba, Japan.

[Randriamahefa] Randriamahefa, R., Cocquerez, J., Fluhr, C., P'epin, F., Philipp, S.: Printed music recognition. In: Proceedings of Second IAPR Int. Conf. on Document Analysis and Recognition, ICDAR'93. (1993) 898-901 Tsukuba, Japan.

[Fahmy] Fahmy, H., Blonstein, D.: A graph grammar programming style for recognition of music notation. Machine Vision and Applications 6 (1993) 83-99.

[Llad] Llad'os, J., S'anchez, G., Mart'$_1$, E.: A string-based method to recognize symbols and structural textures in architectural plans. In Tombre, K., Chhabra, A., eds.: Graphics Recognition: Algorithms and Systems. Springer, Berlin (1998) 91-103 Vol. 1389 of LNCS.

[Valveny] Valveny, E., Mart'$_1$, E.: Hand-drawn symbol recognition in graphic documents using deformable template matching and a bayesian framework. In: Proceedings of 15th. Int. Conf. on Pattern Recognition. Volume 2. (2000) 239-242 Barcelona, Spain.

[Ah-Soon] Ah-Soon, C., Tombre, K.: Architectural symbol recognition using a network of constraints. PRL 22 (2001) 231-248.

[Aoki] Aoki, Y., Shio, A., Arai, H., Odaka, K.: A prototype system for interpreting handsketched floor plans. In: Proceedings of 13th. Int. Conf. on Pattern Recognition. (1996) 747-751 Vienna, Austria.

[Bunke] Bunke, H.: Attributed programmed graph grammars and their application to the schematic diagram interpretation. IEEE Trans. on PAMI 4 (1982) 574-582.

[Yu] Yu, Y., Samal, A., Seth, C.: A system for recognizing a large class of engineering drawings. IEEE Trans. on PAMI 19 (1997) 868-890.

[Kasturi] Kasturi, R., Bow, S., El-Masri, W., Shah, J., Gattiker, J., Mokate, U.: A system for interpretation of line drawings. IEEE Trans. on PAMI 12 (1990) 978-992.

[Lavirotte] Lavirotte, S., Pottier, L.: Optical formula recognition. In: Proceedings of 4th Int. Conf. on Document Analysis and Recognition. (1997) 357-361 Ulm, Germany.

[Lee] Lee, H., Lee, M.: Understanding mathematical expressions using procedure-oriented transformation. PR 27 (1994) 447-457.

[Ramel] Ramel, J., Boissier, G., Emptoz, H.: A structural representation adapted to hand-written symbol recognition. In Chhabra, A., Dori, D., eds.: Graphics Recognition: Recent Advances. Springer-Verlag, Berlin (2000) 228-237 Vol. 1941 of LNCS.

[Cinnamon] United States Patent Application Publication No. 20190057520, filed on Oct. 31, 2017 with inventors Ian Cinnamon, Bruno Brasil Ferrari Faviero, and Simanta Gautam entitled "Generating Synthetic Image Data".

What is claimed is:

1. A computer-implemented method for extracting building information model (BIM) elements for a floor plan drawing, comprising:
   obtaining a raster image of the floor plan drawing;
   determining a design drawing area by parsing the raster image;
   extracting vectorized elements from the design drawing area;
   programmatically generating a synthetic floor plan design drawing dataset, wherein synthetic symbol labels, synthetic symbol locations, and synthetic symbol orientations of synthetic data in the synthetic floor plan design drawing dataset are known, and wherein the synthetic floor plan design drawing dataset is synthetic;
   based on the vectorized elements and the synthetic floor plan design drawing dataset, detecting a symbol represented by the vectorized elements, wherein the symbol comprises a symbol label;
   determining, based on the synthetic floor plan design drawing dataset, an orientation of the detected symbol;
   based on the symbol label, fetching a building information model (BIM) element; and
   based on the symbol orientation, placing the BIM element in the floor plan drawing.

2. The computer-implemented method of claim 1, wherein the obtaining the raster image comprises:
   obtaining a portable document format (PDF) file of the floor plan drawing;
   removing background gridlines with a rule-based method;
   removing background elements using color information; and
   rastering the PDF file into images.

3. The computer-implemented method of claim 1, wherein the determining the design drawing area comprises:
   using a machine learning model to segment the raster image into multiple sections, wherein the machine learning model identifies fixed patterns of a layout of the floor plan drawing; and
   selecting one or more of the multiple sections that comprise the design drawing area.

4. The computer-implemented method of claim 1, wherein the extracting vectorized elements comprises:
   grouping the vectorized elements to form a candidate area of candidate elements; and
   filtering out candidate elements based on a size of candidate element bounding boxes.

5. The computer-implemented method of claim 1, wherein the obtaining a synthetic floor plan design drawing dataset comprises:
   generating the synthetic floor plan design drawing dataset based on a symbol library and synthetic floor plan dataset.

6. The computer-implemented method of claim 5, further comprising:
   tiling the synthetic floor plan design drawing dataset into multiple tiles; and
   processing each of the multiple tiles independently.

7. The computer-implemented method of claim 1, wherein the detecting a symbol comprises:
   determining a confidence level for the symbol;
   determining that the confidence level is below a threshold confidence level; and
   filtering out the symbol based on the determining that the confidence level is below the threshold confidence level;
   determining a second confidence level for a second symbol;
   determining that the second confidence level is above the threshold confidence level; and
   retaining the second symbol for further processing based on the determining that the second confidence level is above the threshold confidence level.

8. The computer-implemented method of claim 1, wherein the determining then orientation of the symbol comprises:
   training a symbol orientation classification model;
   predicting the orientation based on the symbol orientation classification model.

9. The computer-implemented method of claim 8, wherein the training comprises:
   utilizing the known symbol orientation in the synthetic floor plan design drawing dataset for orientation information learning in the symbol orientation classification model.

10. The computer-implemented method of claim 1, further comprising:
    presenting the floor plan drawing with the placed BIM element;
    receiving user feedback; and
    retraining an object detection model and a symbol orientation classification model based on the user feedback.

11. The computer-implemented method of claim 1, further comprising:
training a machine learning (ML) model using the synthetic floor plan design drawing dataset as a base;
detecting the symbol further based on the ML model; and
updating the ML model based on the BIM element in the floor plan drawing.

12. A computer-implemented system for extracting building information model (BIM) elements for a floor plan drawing, comprising:
(a) a computer having a memory;
(b) a processor executing on the computer;
(c) the memory storing a set of instructions, wherein the set of instructions, when executed by the processor cause the processor to perform operations comprising:
  (i) obtaining a raster image of the floor plan drawing;
  (ii) determining a design drawing area by parsing the raster image;
  (iii) extracting vectorized elements from the design drawing area;
  (iv) programmatically generating a synthetic floor plan design drawing dataset, wherein synthetic symbol labels, synthetic symbol locations, and synthetic symbol orientations of synthetic data in the synthetic floor plan design drawing dataset are known, and wherein the synthetic floor plan design drawing dataset is synthetic;
  (v) based on the vectorized elements and the synthetic floor plan design drawing dataset, detecting a symbol represented by the vectorized elements, wherein the symbol comprises a symbol label;
  (vi) determining, based on the synthetic floor plan design drawing dataset, an orientation of the detected symbol;
  (vii) based on the symbol label, fetching a building information model (BIM) element; and
  (viii) based on the symbol orientation, placing the BIM element in the floor plan drawing.

13. The computer-implemented system of claim 12, wherein the obtaining the raster image comprises:
obtaining a portable document format (PDF) file of the floor plan drawing;
removing background gridlines with a rule-based method;
removing background elements using color information; and
rastering the PDF file into images.

14. The computer-implemented system of claim 12, wherein the determining the design drawing area comprises:
using a machine learning model to segment the raster image into multiple sections, wherein the machine learning model identifies fixed patterns of a layout of the floor plan drawing; and
selecting one or more of the multiple sections that comprise the design drawing area.

15. The computer-implemented system of claim 12, wherein the extracting vectorized elements comprises:
grouping the vectorized elements to form a candidate area of candidate elements; and
filtering out candidate elements based on a size of candidate element bounding boxes.

16. The computer-implemented system of claim 12, wherein the obtaining a synthetic floor plan design drawing dataset comprises:
generating the synthetic floor plan design drawing dataset based on a symbol library and synthetic floor plan dataset.

17. The computer-implemented system of claim 16, further comprising:
tiling the synthetic floor plan design drawing dataset into multiple tiles; and
processing each of the multiple tiles independently.

18. The computer-implemented system of claim 12, wherein the detecting a symbol comprises:
determining a confidence level for the symbol;
determining that the confidence level is below a threshold confidence level; and
filtering out the symbol based on the determining that the confidence level is below the threshold confidence level;
determining a second confidence level for a second symbol;
determining that the second confidence level is above the threshold confidence level; and
retaining the second symbol for further processing based on the determining that the second confidence level is above the threshold confidence level.

19. The computer-implemented system of claim 12, wherein the determining then orientation of the symbol comprises:
training a symbol orientation classification model;
predicting the orientation based on the symbol orientation classification model.

20. The computer-implemented system of claim 19, wherein the training comprises:
utilizing the known symbol orientation in the synthetic floor plan design drawing dataset for orientation information learning in the symbol orientation classification model.

21. The computer-implemented system of claim 12, further comprising:
presenting the floor plan drawing with the placed BIM element;
receiving user feedback; and
retraining an object detection model and a symbol orientation classification model based on the user feedback.

22. The computer-implemented system of claim 12, wherein the operations further comprise:
training a machine learning (ML) model using the synthetic floor plan design drawing dataset as a base;
detecting the symbol further based on the ML model; and
updating the ML model based on the BIM element in the floor plan drawing.

* * * * *